United States Patent
Itafuji et al.

(10) Patent No.: US 8,573,560 B2
(45) Date of Patent: Nov. 5, 2013

(54) VACUUM CONTROL VALVE AND VACUUM CONTROL SYSTEM

(75) Inventors: Hiroshi Itafuji, Komaki (JP); Masayuki Kouketsu, Komaki (JP)

(73) Assignee: CKD Corporation, Komaki-shi, Aichi (JP)

( * ) Notice: Subject to any disclaimer, the term of this patent is extended or adjusted under 35 U.S.C. 154(b) by 0 days.

(21) Appl. No.: 13/413,593

(22) Filed: Mar. 6, 2012

(65) Prior Publication Data

US 2012/0160344 A1 Jun. 28, 2012

Related U.S. Application Data

(62) Division of application No. 12/986,119, filed on Jan. 6, 2011, now Pat. No. 8,210,196.

(30) Foreign Application Priority Data

| Jan. 15, 2010 | (JP) | 2010-007104 |
| May 17, 2010 | (JP) | 2010-113694 |
| May 17, 2010 | (JP) | 2010-113695 |

(51) Int. Cl.
*F16K 31/00* (2006.01)

(52) U.S. Cl.
USPC .......................................... 251/335.2; 91/459

(58) Field of Classification Search
USPC ........ 137/487.5, 554; 251/324, 335.2; 91/459
See application file for complete search history.

(56) References Cited

U.S. PATENT DOCUMENTS

| 3,518,032 | A | * | 6/1970 | Degroff et al. ................. 417/440 |
| 5,542,336 | A | * | 8/1996 | Larkin ............................. 91/166 |
| 5,678,595 | A | * | 10/1997 | Iwabuchi ........................ 137/341 |
| 6,041,814 | A | | 3/2000 | Kouketsu et al. |
| 6,508,268 | B1 | * | 1/2003 | Kouketsu ....................... 137/488 |
| 7,117,886 | B2 | * | 10/2006 | Kajitani et al. ............. 137/487.5 |
| 7,163,024 | B2 | * | 1/2007 | Igawa et al. .................... 137/486 |
| 8,321,059 | B2 | * | 11/2012 | Carter et al. ................... 700/282 |
| 2008/0176412 | A1 | | 7/2008 | Komeda |

(Continued)

FOREIGN PATENT DOCUMENTS

| JP | 9-72458 | 3/1997 |
| JP | 9-89126 | 3/1997 |

(Continued)

OTHER PUBLICATIONS

Office Action dated May 31, 2011 from Japanese Application No. 2010-113695.

(Continued)

*Primary Examiner* — John K Fristoe, Jr.
*Assistant Examiner* — R. K. Arundale
(74) *Attorney, Agent, or Firm* — Beyer Law Group LLP

(57) ABSTRACT

The invention provides a vacuum control valve configured to control the vacuum pressure in the vacuum chamber. The vacuum control valve includes a control valve main body, an operation unit, a cylinder, a biasing unit, and a bellofram. The operation unit and the cylinder include a valve opening manipulation chamber and a shutoff load generation chamber. The shutoff load generation chamber is configured to have a common axial center line with the valve opening manipulation chamber and to generate a load applied to the operation unit in a direction for reducing the lift in accordance with a supply of the working fluid. And the shutoff load generation chamber may be formed in an interior of the rod.

16 Claims, 21 Drawing Sheets

(56) References Cited

U.S. PATENT DOCUMENTS

| | | |
|---|---|---|
| 2009/0057600 A1* | 3/2009 | Watanabe et al. .......... 251/335.2 |
| 2009/0255591 A1* | 10/2009 | Grout et al. ................... 137/334 |
| 2010/0327203 A1 | 12/2010 | Nagai et al. |
| 2012/0326070 A1* | 12/2012 | Johnson et al. ............... 251/324 |

FOREIGN PATENT DOCUMENTS

| | | |
|---|---|---|
| JP | 11-351435 | 12/1999 |
| JP | 2001-257164 | 9/2001 |
| JP | 2003-56512 | 2/2003 |
| JP | 2003-322111 | 11/2003 |
| JP | 2008-177501 | 7/2008 |
| JP | 2009-30122 | 2/2009 |
| JP | 2009-117444 | 5/2009 |
| JP | 2011-100786 | 5/2011 |
| WO | 2009/091935 | 7/2009 |

OTHER PUBLICATIONS

Office Action dated Jul. 26, 2013 from Chinese Application No. 201110006248.5.

* cited by examiner

Fully open condition (Pendulum type valve)

FIG. 9

Calculation formulae for conductance Ca $$\frac{1}{2}Q = C(P1 - P2a) \quad \cdots F1$$

$$C = \frac{Q}{2(P1 - P2a)} \quad \cdots F2$$

Calculation formulae for effective exhaust velocity $$\frac{1}{Sa1} = \frac{1}{Sa2} + \frac{1}{C} \quad \cdots F3$$

$$Sa1 = \frac{C \times Sa2}{Sa2 + C} \quad \cdots F4$$

Equation of continuity (Mass conservation)

$$P1 \times Sa1 = P2a \times Sa2 = \frac{1}{2}Q \quad \cdots F5$$

VACUUM CONTROL VALVE AND VACUUM CONTROL SYSTEM

CROSS-REFERENCE TO RELATED APPLICATIONS

This application is a Divisional Application of U.S. patent application Ser. No. 12/986,119, filed on Jan. 6, 2011 which claims priority of Japanese Patent Application No. 2010-007104 filed on Jan. 15, 2010, Japanese Patent Application No. 2010-113694 filed on May 17, 2010 and Japanese Patent Application No. 2010-113695 filed on May 17, 2010, all of which, including the US application, are hereby incorporated by reference.

BACKGROUND OF THE INVENTION

1. Field of the Invention

The present invention relates to a technique for controlling the behavior of a fluid in a vacuum chamber used in a manufacturing process with a vacuum control valve.

2. Description of the Related Art

A semiconductor manufacturing process includes a process of disposing a wafer W inside a vacuum chamber 710 (see FIGS. 1, 2) and exposing a processing surface Ws of the wafer W to a processing gas (also referred to simply as gas in this specification), as in chemical vapor deposition (CVD), for example. The processing gas contains a thin film forming element and reacts on the processing surface Ws to form a film material.

The processing gas must be supplied to the wafer W evenly and with stability in order to form the film evenly. In a conventional CVD process, however, one configuration as shown in FIGS. 1 and 2 is employed such that discharge is performed by a vacuum pump while supplying the processing gas. During this discharge control, a conductance of an exhaust system is typically manipulated using a pendulum type valve, an opening/closing amount of which is manipulated by moving a pendulum 720 as disclosed in Japanese Patent Application Publication Laid-open No. 2009-117444.

With this method, however, when a position of the pendulum 720 is moved in order to adjust the conductance, a center of an opening portion moves together with the pendulum 720. When the center of the opening portion moves in this manner, bias is generated between gas flows FL1, FL2 through the interior of the vacuum chamber 710, leading to unevenness in the gas supply such as the formation of a stagnation region in which the gas supply is disrupted, for example.

Moreover, in another configuration where the gas is supplied from one side of the wafer W and discharged from the other side of the wafer W, this unevenness in the gas supply occurs as a reduction in a concentration of the thin film forming element in the vicinity of the exhaust side of the wafer W. This bias in the gas supply generates unevenness in a film thickness on the processing surface Ws, and this phenomenon becomes gradually more apparent with increases in the precision and density of products such as that described above.

SUMMARY OF THE INVENTION

An object of the present invention is to provide a vacuum control valve that is capable of improving a control capability of a vacuum control system.

The above and other object of the present invention are attained at least partly by a vacuum control valve according to a first aspect of the present invention. The vacuum control valve is connected between a vacuum chamber and a vacuum pump and configured to control the vacuum pressure in the vacuum chamber by manipulating valve opening using working fluid. The vacuum control valve may include a control valve main body, an operation unit, a cylinder, a biasing unit, and a bellofram. The control valve main body has a flow passage and a valve seat formed in the flow passage. The flow passage connects the vacuum chamber and the vacuum pump. The operation unit has a valve body, a piston, and a rod that joins the valve body and the piston. The valve body manipulates the valve opening by adjusting a lift and blocks the flow passage by contacting the valve seat. The lift is a distance between the valve body and the valve seat. The cylinder is connected to the control valve main body and housing the piston. The biasing unit is configured to press the operation unit in a direction for reducing the lift. The bellofram is configured to seal a gap between an outer peripheral surface of the piston and an inner peripheral surface of the cylinder following a movement of the piston. The operation unit and the cylinder include a valve opening manipulation chamber and a shutoff load generation chamber. The valve opening manipulation chamber is sealed by the bellofram. The valve opening manipulation chamber has a tubular shape surrounding the rod. The valve opening manipulation chamber generates a load applied to the piston in a direction for increasing the lift in accordance with a pressure exerted by the working fluid. The shutoff load generation chamber is configured to have a common axial center line with the valve opening manipulation chamber and to generate a load applied to the operation unit in a direction for reducing the lift in accordance with a supply of the working fluid. The shutoff load generation chamber may be formed in an interior of the rod.

With the first aspect of the present invention, the control is performed by a vacuum control valve in which the gap between the outer peripheral surface of the piston and the inner peripheral surface of the cylinder is tightly sealed by a sealing film-form elastic body while following an operation of the piston. The vacuum control valve is configured in this manner has a low hysteresis characteristic, and therefore a control capability of the vacuum control system can be improved dramatically.

The above and other object of the present invention are attained at least partly by a vacuum control valve according to a second aspect of the present invention. The vacuum control valve is connected between a vacuum chamber and a vacuum pump and configured to control the vacuum pressure in the vacuum chamber by manipulating valve opening using working fluid. The vacuum control valve may include a control valve main body, an operation unit, a cylinder, a biasing unit, and a bellofram. The control valve main body has a flow passage and a valve seat formed in the flow passage. The flow passage connects the vacuum chamber and the vacuum pump. The operation unit has a valve body, a piston, and a rod that joins the valve body and the piston. The valve body manipulates the valve opening by adjusting a lift and blocks the flow passage by contacting the valve seat. The lift is a distance between the valve body and the valve seat. The cylinder is connected to the control valve main body and housing the piston. The biasing unit is configured to press the operation unit in a direction for reducing the lift. The bellofram is configured to seal a gap between an outer peripheral surface of the piston and an inner peripheral surface of the cylinder following a movement of the piston. The operation unit and the cylinder include a valve opening manipulation chamber and a shutoff load generation chamber. The valve opening manipulation chamber is sealed by the bellofram. The valve opening manipulation chamber has a tubular shape surrounding the rod. The valve opening manipulation chamber generates a load applied to the piston in a direction for increasing the lift in accordance with a pressure exerted by the working fluid. The shutoff load generation chamber is configured to have a common axial center line with the valve opening manipulation chamber and to generate a load applied to the operation unit in a direction for reducing the lift in accordance with a supply of the working fluid. The cylinder includes a head cover comprising a sliding convex portion accommodated in the shutoff load generation chamber. The vacuum control valve includes a sealing unit having a sealing surface sealing between the shutoff load generation chamber and the sliding convex portion. The sealing surface applying a surface pressure increasing according to the supply of the working fluid to the shutoff load generation chamber.

In the vacuum control valve of the second aspect of the present invention, the sealing unit in which the surface pressure of the sealing surface increases in accordance with the supply of the working fluid to the shutoff load generation chamber is used in the shutoff load generation chamber. Therefore, during manipulation of the valve opening, or in other words when the vacuum control valve is not blocked, the surface pressure on the sealing surface of the shutoff load generation chamber can be suppressed, enabling low-friction sliding. As a result, low-hysteresis valve opening manipulation can be realized by a simple configuration without using a bellofram, for example.

Note that the present invention is not limited to a semiconductor manufacturing device and may be applied to a semiconductor manufacturing method. The present invention may also be used in a processing device for passing a gas through a vacuum chamber.

These and other object, features, aspects and advantages of the present invention will become more apparent from the following detailed description of the preferred embodiments with the accompanying drawings.

BRIEF DESCRIPTION OF THE DRAWINGS

FIG. 9 is an illustrative view showing formulae used to calculate an effective exhaust velocity;

DESCRIPTION OF THE EMBODIMENTS

Specific embodiments of the present invention will be described below with reference to the drawings.

A. Configuration of Vacuum Control System According to First Embodiment

Figure 1:
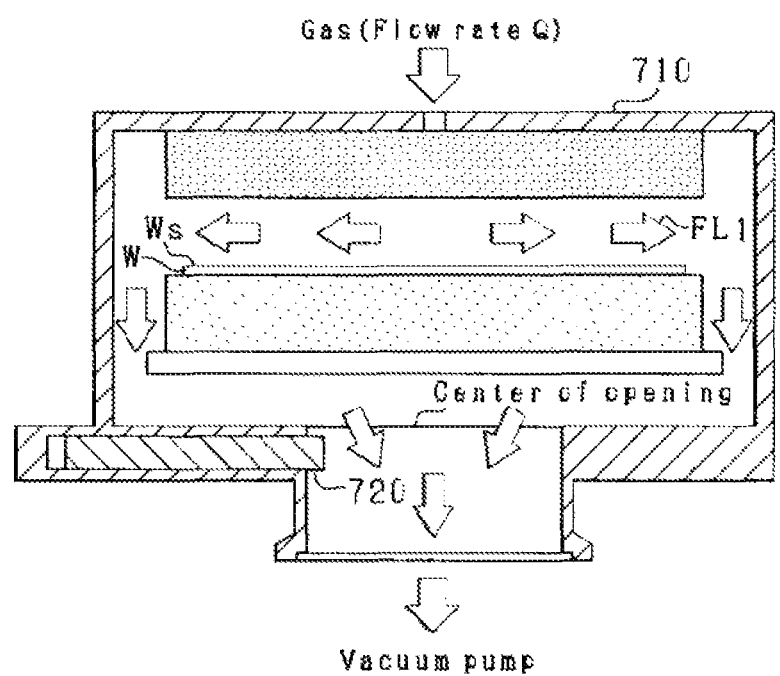
FIG. 1 is an illustrative view showing a gas flow inside of vacuum chamber 710 in full open condition as the prior art.
Figure 2:
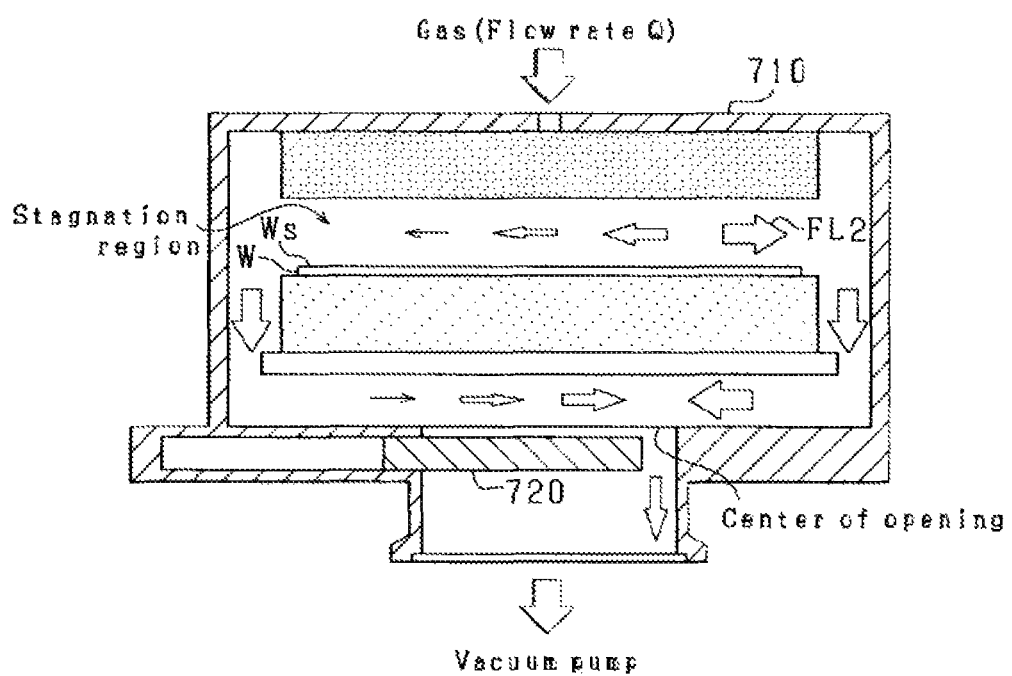
FIG. 2 is an illustrative view showing a gas flow inside of vacuum chamber 710 in little open condition as the prior art.
Figure 3:
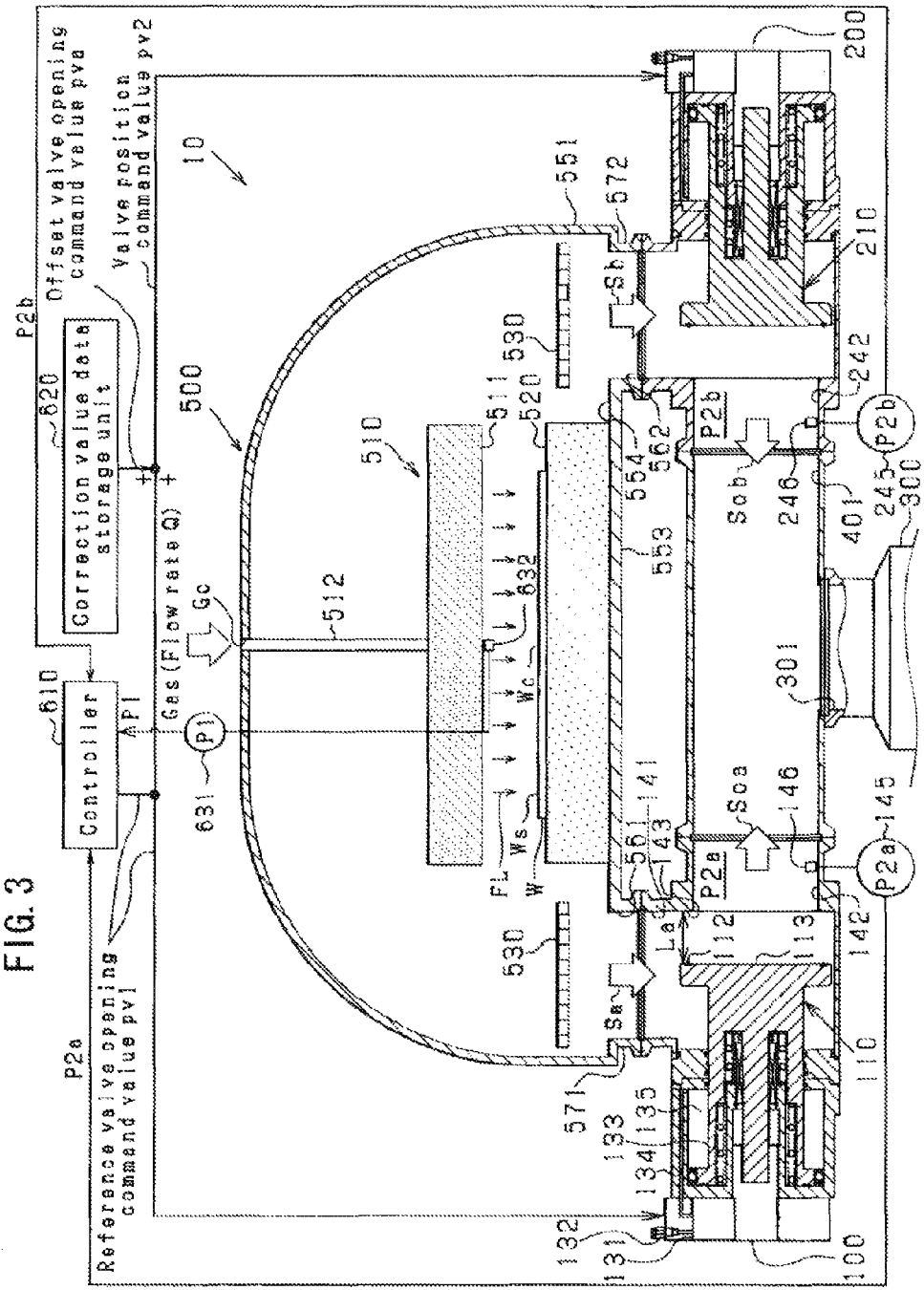
FIG. 3 is a sectional view showing the configuration of a vacuum control system 10 according to the first embodiment.
Figure 4:
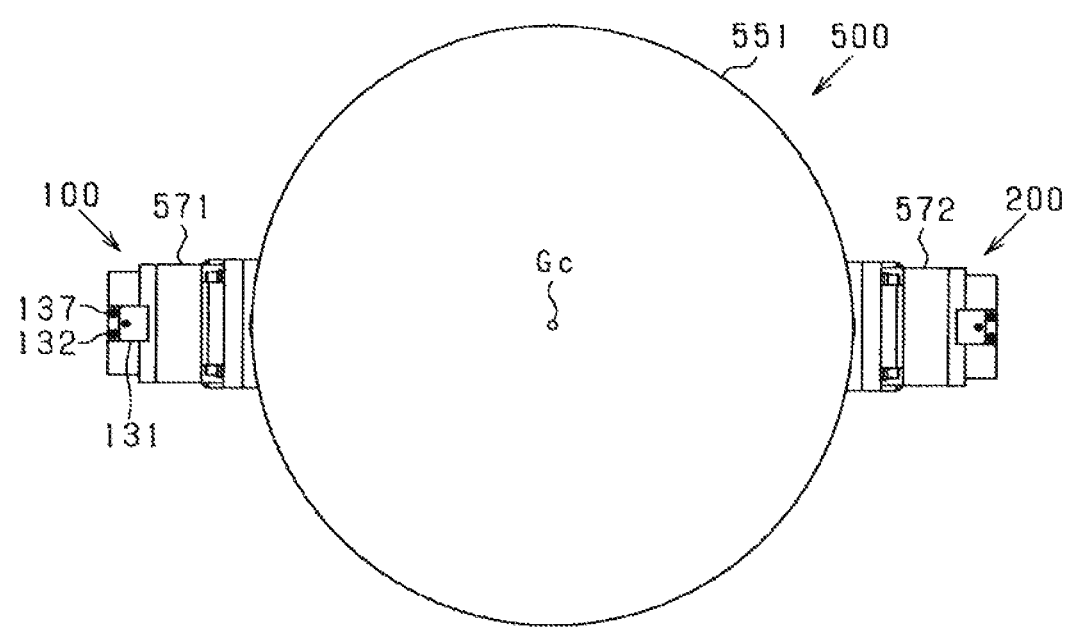
FIG. 4 is a plan view of the vacuum control system 10.

FIG. 3 is a sectional view showing the configuration of a vacuum control system 10 according to the first embodiment. FIG. 4 is a plan view of the vacuum control system 10 according to the first embodiment. The vacuum control system 10 controls a flow of gas supplied to a vacuum chamber 500 in which a chemical vapor deposition (CVD) process is performed. The vacuum control system 10 includes two vacuum control valves 100, 200 and a single turbo-molecular pump 300. The vacuum control valve 100 is connected between a gas discharge port 561 of the vacuum chamber 500 and the turbo-molecular pump 300. The vacuum control valve 200 is connected between a gas discharge port 562 of the vacuum chamber 500 and the turbo-molecular pump 300. In this embodiment, the two vacuum control valves 100, 200 have identical configurations. A dry pump (not shown) is connected to the turbo-molecular pump 300 in series therewith.

The vacuum chamber 500 includes a wafer table 520 for supporting a wafer W serving as a processing object, a gas dispersion unit 510 that disperses a gas over a processing surface Ws of the wafer W, a shielding plate 530 for protecting the vacuum control valves 100, 200, and a pressure measurement unit 631. In the first embodiment, the processing surface Ws is supported by the wafer table 520 on a horizontal plane, or in other words parallel to a perpendicular plane to a gravity direction. A gas supply pipe 512 for supplying the gas from the exterior of the vacuum chamber 500 and a support structure (not shown) are connected to the gas dispersion unit 510.

The gas dispersion unit 510 has an opposing surface 511 that is parallel to the processing surface Ws. The opposing surface 511 supplies a gas flow FL from a substantially perpendicular direction to the processing surface Ws. The shielding plate 530 has a disc shape that covers the respective gas discharge ports 561, 562. In the first embodiment, the pressure measurement unit 631 includes a pressure detection unit 632 that detects a pressure in the vicinity of a processing center Wc in a horizontal plane. In this specification, the term "in a horizontal plane" means "projected onto a horizontal plane". The processing center Wc is a preset position in a region where processing is performed. The region in which the processing is performed will also be referred to as a "processing reaction region". Substantially no pressure loss occurs in the processing reaction region, and therefore the pressure detection unit 632 may be disposed anywhere in the processing reaction region.

As is evident from FIGS. 3 and 4, a casing of the vacuum chamber 500 includes a dome-shaped dome portion 551 housing the gas dispersion unit 510, two gas exhaust pipes 571, 572, and a lower portion casing 553 to which the wafer table 520 is fixed via a pedestal 554. The dome portion 551 includes a gas supply port Gc in the vicinity of the processing center Wc in the horizontal plane.

As is evident from FIG. 4, the two gas exhaust pipes 571, 572 are attached in positions sandwiching the processing reaction region in the horizontal plane. The vacuum control valves 100, 200 are respectively connected to the two gas exhaust pipes 571, 572. The two vacuum control valves 100, 200 are connected in mutually opposing orientations also in positions sandwiching the processing reaction region in the horizontal plane.

The gas flows through the vacuum chamber 500 as follows. As shown in FIG. 3, the gas is supplied to the vacuum chamber 500 from the gas supply port Gc. As noted above, the gas supplied from the gas supply port Gc is supplied as the gas flow FL from the opposing surface 511 of the gas dispersion unit 510 in a substantially perpendicular direction to the processing surface Ws. The gas supplied to the processing surface Ws bypasses the shielding plate 530 so as to be suctioned into the gas discharge ports 561, 562 while executing CVD processing on the processing surface Ws. The gas suctioned into the gas discharge ports 561, 562 is discharged from the turbo-molecular pump 300 via the two vacuum control valves 100, 200. The turbo-molecular pump 300 generates effective exhaust velocities Soa, Sob (m^3/sec) in the vicinity of an inlet 301. The effective exhaust velocity Soa is a share apportioned to a flow passage passing through the gas discharge port 561. The effective exhaust velocity Sob is a share apportioned to a flow passage passing through the gas discharge port 562. In the first embodiment, the two effective exhaust velocities Soa, Sob are identical.

The vacuum control valve 100 includes an upstream side flow passage 141 connected to the gas discharge port 561 of the vacuum chamber 500, a downstream side flow passage 142 connected to the turbo-molecular pump 300, a poppet valve body 110 for connecting and disconnecting the upstream side flow passage 141 and the downstream side flow passage 142, a biasing spring 133 for biasing or press the poppet valve body 110 to a closed side, a cylinder chamber 135 for moving the poppet valve body 110 to an open side using a force of compressed air, an air flow passage 134 for leading the compressed air to the cylinder chamber 135, an electro-pneumatic control valve 131 for manipulating the compressed air supplied to the air flow passage 134, an air port 132 for supplying the compressed air to the electro-pneumatic control valve 131, and a discharge port 137 (see FIG. 4) for discharging the compressed air from the electro-pneumatic control valve 131.

The downstream side flow passage 142 is provided with a pressure sensor 145 having a detection surface 146 for measuring a pressure P2a in the flow passage interior. The vacuum control valve 200 likewise includes a pressure sensor 245 having a detection surface 246 for measuring a pressure P2b in a flow passage interior. The poppet valve body 110 includes an elastic sealing member 112, and when the poppet valve body 110 is pressed against a valve seat 143 by the biasing spring 133, the upstream side flow passage 141 is blocked from the downstream side flow passage 142.

A conductance of the vacuum control valve 100 is manipulated by manipulating a lift of the poppet valve body 110. In this specification, the lift denotes a distance La between the poppet valve body 110 and the valve seat 143. By adjusting the lift La, the conductance of the vacuum control valve 100 can be manipulated as a conductance between the upstream side flow passage 141 and the downstream side flow passage 142. The vacuum control valve 200 is configured identically to the vacuum control valve 100, and the conductance thereof can be manipulated using a similar method. An internal pressure of the downstream side flow passage 142 varies according to this manipulation of the conductance. The internal pressure P2a is measured by the pressure sensor 145 provided in the interior of the downstream side flow passage 142 and having the detection surface 146, and then transmitted to a controller 610. The internal pressure P2b is measured similarly in the vacuum control valve 200 and transmitted to the controller 610.

Figure 5:
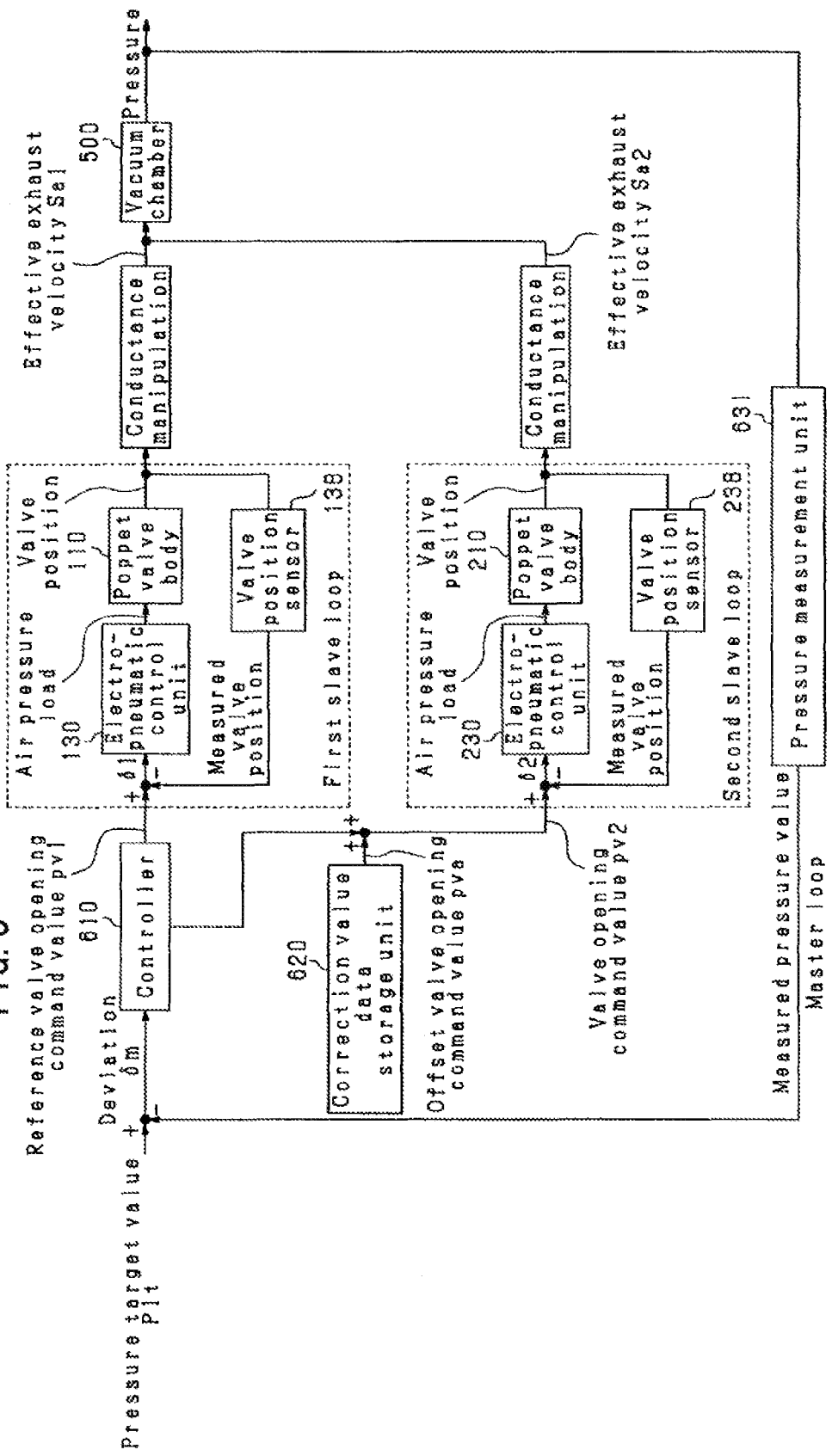
FIG. 5 is a control block diagram of the vacuum control system 10.

B. Configuration and Operation of Vacuum Control System According to First Embodiment FIG. 5 is a control block diagram of the vacuum control system 10 according to the first embodiment. This control system is constituted by cascade control having a double loop structure including a first slave loop for controlling the lift of the poppet valve body 110 in the vacuum control valve 100, a second slave loop for controlling the lift of a poppet valve body 210 in the vacuum control valve 200, and a master loop for controlling the internal pressure of the vacuum chamber 500. The respective control loops of the slave loops and the master loop may be constituted by a well known PID control system, for example. The slave loop and the master loop will also be referred to as a dependent control unit and a main control unit, respectively.

The first slave loop is a control loop in which the electro-pneumatic control valve 131 (see FIG. 3) of an electro-pneumatic control unit 130 manipulates the pressure of the cylinder chamber 135 in order for the position of the poppet valve body 110 to approach a target value. The electro-pneumatic control valve 131 is capable of manipulating the internal pressure of the cylinder chamber 135 so that the lift is manipulated according to a balance with a biasing force of the biasing spring 133. The target value is provided to the electro-pneumatic control valve 131 by the controller 610 as a reference valve opening command value pv1 expressing the lift of the poppet valve body 110. The lift of the poppet valve body 110 is measured by a valve position sensor 138 and fed back to the electro-pneumatic control valve 131. The reference valve opening command value pv1 will also be referred to as a common opening command value.

In the first slave loop, the lift of the poppet valve body 110 is manipulated to reduce a deviation 81 between a feedback amount and the reference valve opening command value pv1. Hence, in the first slave loop, the lift of the poppet valve body 110 can be controlled to approach the reference valve opening command value pv1 supplied from the controller 610. Manipulation of the lift is physically equivalent to manipulation of an orifice diameter.

Note that the internal pressure of the cylinder chamber 135 may be measured and used as the feedback amount instead of the lift. However, when the lift is fed back, a reduction in precision caused by non-linearity in a command value (control input) from the master loop and the lift (opening) can be suppressed. This reduction in precision occurs when opening ranges of the respective vacuum control valves are shifted relative to each other by an offset value. With this configuration, the opening is actually measured, and therefore linearity can be secured in the opening and the control input. Hence, even if the opening ranges shift, characteristic variation among the vacuum control valves can be reduced.

The second slave loop differs from the first slave loop in that the target value is a valve opening command valve pv2 rather than the reference valve opening command value pv1, but shares all other configurations with the first slave loop. The valve opening command valve pv2 is a command value generated by adding an offset valve opening command value pva to the reference valve opening command value pv1. A value read from a correction value data storage unit 620 is used as the offset valve opening command value pva. The offset valve opening command value pva is set such that effective exhaust velocities Sa, Sb (m^3/sec) when the entire control system is in a stable steady state are identical. The correction value data storage unit 620 will also be referred to as an offset value storage unit.

The effective exhaust velocity Sa1 (see FIG. 5) denotes an exhaust velocity generated when a flow passage extending from the processing center Wc to the inlet 301 of the turbo-molecular pump 300 via the gas discharge port 561 (see FIG. 3) and the turbo-molecular pump 300 are considered as a whole and the processing center Wc is handled as the inlet of the turbo-molecular pump 300. The processing center Wc is a position in which pressure measurement is performed by the pressure measurement unit 631. The effective exhaust velocity Sa1 is an exhaust velocity obtained by taking into account a reduction caused by conductance from the processing center Wc to the inlet 301 of the turbo-molecular pump 300, and denotes the effective exhaust velocity in the processing center Wc. The effective exhaust velocity Sb1 (see FIG. 5), meanwhile, is an exhaust velocity obtained by taking into account a reduction caused by conductance from the processing center Wc to the inlet 301 of the turbo-molecular pump 300 via the gas discharge port 562 (see FIG. 3), and physically denotes the effective exhaust velocity in the processing center Wc.

The turbo-molecular pump 300 generates an identical effective exhaust velocity in the processing center Wc because the effective exhaust velocities Sa1, Sb1 (m^3/sec) are identical thanks to conductance manipulation. Meanwhile, in the processing center Wc, a route passing through the gas discharge port 561 and a route passing through the gas discharge port 562 share an identical pressure, and therefore an identical exhaust flow rate (Pa·m^3/sec) is realized. Accordingly, the gas is discharged from the two gas discharge ports 561, 562 disposed in positions sandwiching the processing reaction region at an identical exhaust flow rate.

The master loop is a control loop in which the controller 610 manipulates the conductance of the two vacuum control valves 100, 200 to cause a pressure in the vicinity of the processing center Wc of the vacuum chamber 500 to approach a pressure target value P1t. The pressure target value P1t is a fixed pressure value set in advance at an appropriate value for the processing. Since the valve opening command value pv2 is corrected by adding the fixed offset valve opening command value pva to the reference valve opening command value pv1, the valve opening command value pv2 and the reference valve opening command value pv1 vary integrally. Accordingly, the two vacuum control valves 100, 200 move integrally using an offset lift as a central position, and therefore a control law can be established easily with substantially no loss of readiness in comparison with control performed by a single vacuum control valve.

Figure 6:
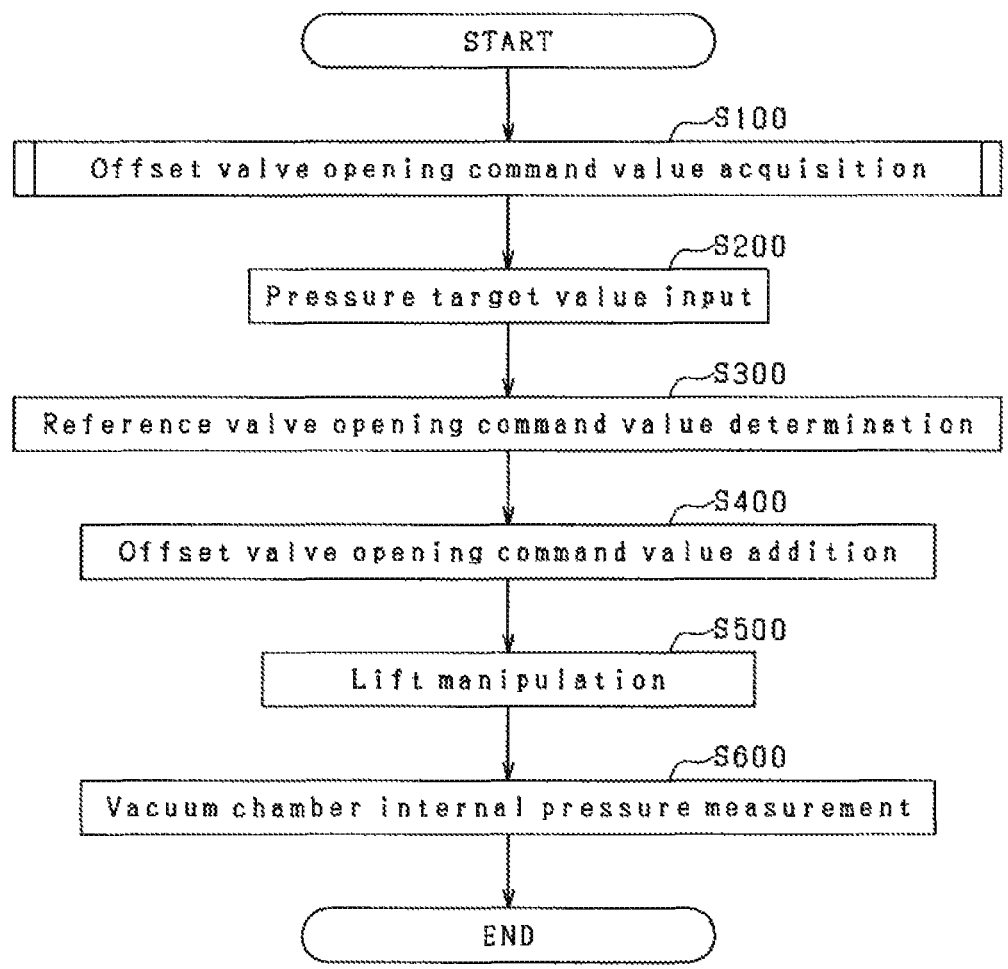
FIG. 6 is a flowchart showing the content of a control system operation of the vacuum control system 10.

FIG. 6 is a flowchart showing the content of a control system operation of the vacuum control system 10 according to the first embodiment. In step S100, a user executes offset valve opening command value acquisition processing. The offset valve opening command value acquisition processing is processing for operating the two vacuum control valves 100, 200 individually to obtain characteristic data, and obtaining the offset valve opening command value pva. The content of the offset valve opening command value acquisition processing will be described in detail below.

In step S200, the user performs pressure target value input processing. The pressure target value input processing is processing for inputting the pressure target value P1t, which is a preset fixed target value, into the controller 610. The pressure target value P1t is determined at an appropriate value for the processing performed in the vacuum chamber 500.

In step S300, the controller 610 executes reference valve opening command value determination processing. The reference valve opening command value determination processing is processing for calculating the reference valve opening command value pv1 successively in accordance with a deviation δm between the measured internal pressure of the vacuum chamber 500 and the pressure target value P1t. The reference valve opening command value pv1 is determined in advance on the basis of a control law stored in the controller 610. The reference valve opening command value pv1 is used as a target value of the first slave loop for controlling the vacuum control valve 100.

In step S400, offset valve opening command value addition processing is performed. The offset valve opening command value addition processing is processing for adding the offset valve opening command value pva read from the correction value data storage unit 620 to the reference valve opening command value pv1. In this addition processing, the valve opening command value pv2 is generated. The valve opening command value pv2 is used as a target value of the second slave loop for controlling the vacuum control valve 200. Hence, the two vacuum control valves 100, 200 are controlled integrally using the reference valve opening command value pv1 and the valve opening command value pv2, which are mutually offset target values, as target values.

In step S500, lift manipulation processing is performed. The lift manipulation processing is processing for manipulating the two poppet valve bodies 110, 210 in accordance with the reference valve opening command value pv1 and the valve opening command value pv2, respectively. As a result, the respective orifice diameters of the vacuum control valves 100, 200 are essentially manipulated such that the conductance of the vacuum control valves 100, 200 is manipulated.

In step S600, vacuum chamber internal pressure measurement processing is performed. The vacuum chamber internal pressure measurement processing is processing in which the pressure measurement unit 631 measures the internal pressure of the vacuum chamber 500. A measurement position is set in the vicinity of the processing center Wc of the vacuum chamber 500. Thus, the pressure in the vicinity of the processing center Wc is controlled to approach the pressure target value P1t and the gas is discharged evenly from the two vacuum control valves 100, 200.

Hence, in the first embodiment, as long as the offset valve opening command value pva can be obtained, a control law can be established easily with substantially no loss of readiness in comparison with control performed by a single vacuum control valve.

Figure 7:
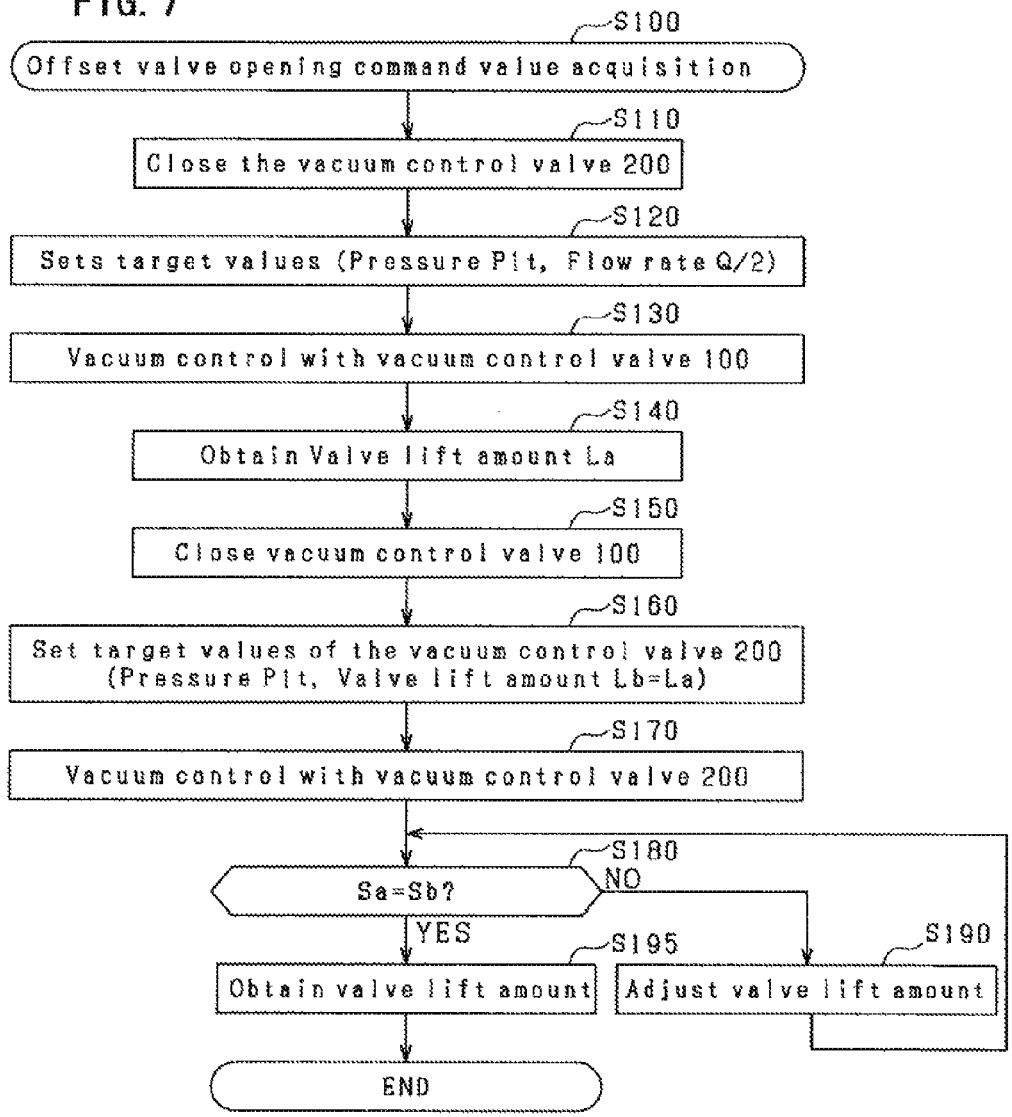
FIG. 7 is a flowchart showing the content of offset valve opening command value acquisition processing.

C. Method of Obtaining Offset Valve Opening Command Value According to First Embodiment FIG. 7 is a flowchart showing the content of the offset valve opening command value acquisition processing according to the first embodiment. In a step S110, the user closes the vacuum control valve 200. As a result, the effect of an operation of the vacuum control valve 200 is eliminated, and therefore characteristic data pertaining to the discharge performed by the vacuum control valve 100 can be obtained.

Figure 8:
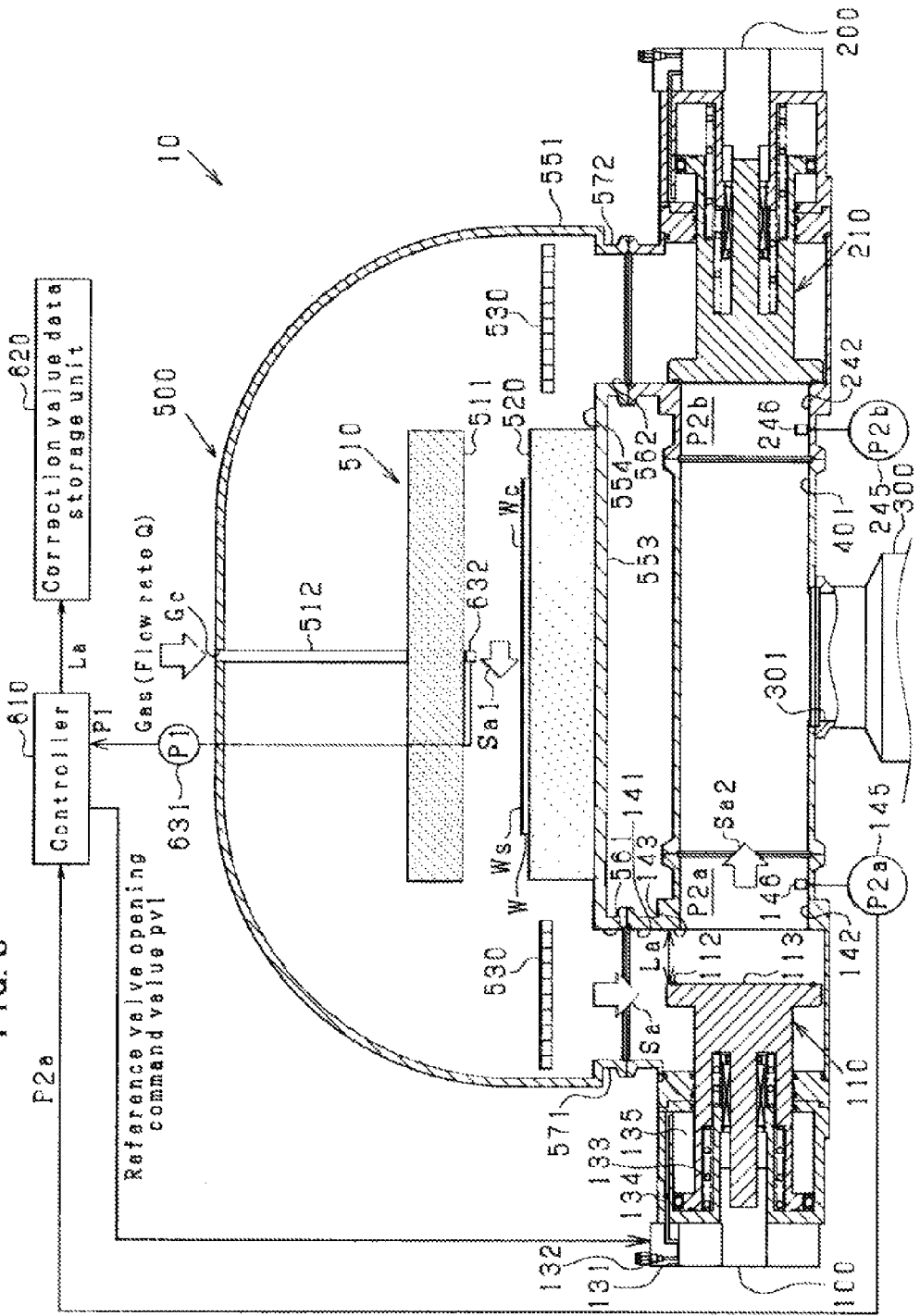
FIG. 8 is an illustrative view showing a condition in which a vacuum control valve 100 operates alone.

FIG. 8 is an illustrative view showing a condition in which the vacuum control valve 100 according to the first embodiment operates alone. In the example of FIG. 8, the vacuum control valve 200 is closed and the vacuum control valve 100 is open, and therefore all of the supplied gas is suctioned into the vacuum control valve 100 through the gas discharge port 561. It is therefore evident that in this state, characteristic data pertaining to the vacuum control valve 100 can be obtained.

In step S120, the user sets target values. The target values are the pressure target value P1$t$ in the vicinity of the processing center Wc and a gas supply amount (Q/2) from the gas supply port Gc. The pressure target value P1$t$ is set at an appropriate vacuum pressure for the envisaged processing. The gas supply amount (Q/2) is set at half of an appropriate flow rate Q for the envisaged processing, which is constituted by a flow rate apportioned to the vacuum control valve 100 and the turbo-molecular pump 300.

In step S130, the user causes the vacuum control valve 100 to execute vacuum control. In preparation for the vacuum control, the user performs vacuuming using the dry pump (not shown) connected in series with the turbo-molecular pump 300 to reduce the internal pressure of the vacuum chamber 500 to a molecular region. The user then activates the turbo-molecular pump 300 to establish a stable operation state.

When the internal pressure of the vacuum chamber 500 reaches the vicinity of the pressure target value P1$t$, the user starts to supply the gas at the flow rate Q/2 and activates vacuum control by the vacuum control valve 100. In the control system shown in FIG. 5, this control is implemented as cascade control in which the master loop and the first slave loop are functional but the second slave loop is stopped. In the gas supply control according to the first embodiment, the gas supply amount (Q/2) takes a set value, and therefore the gas is supplied with stability at this set value.

Figure 10:
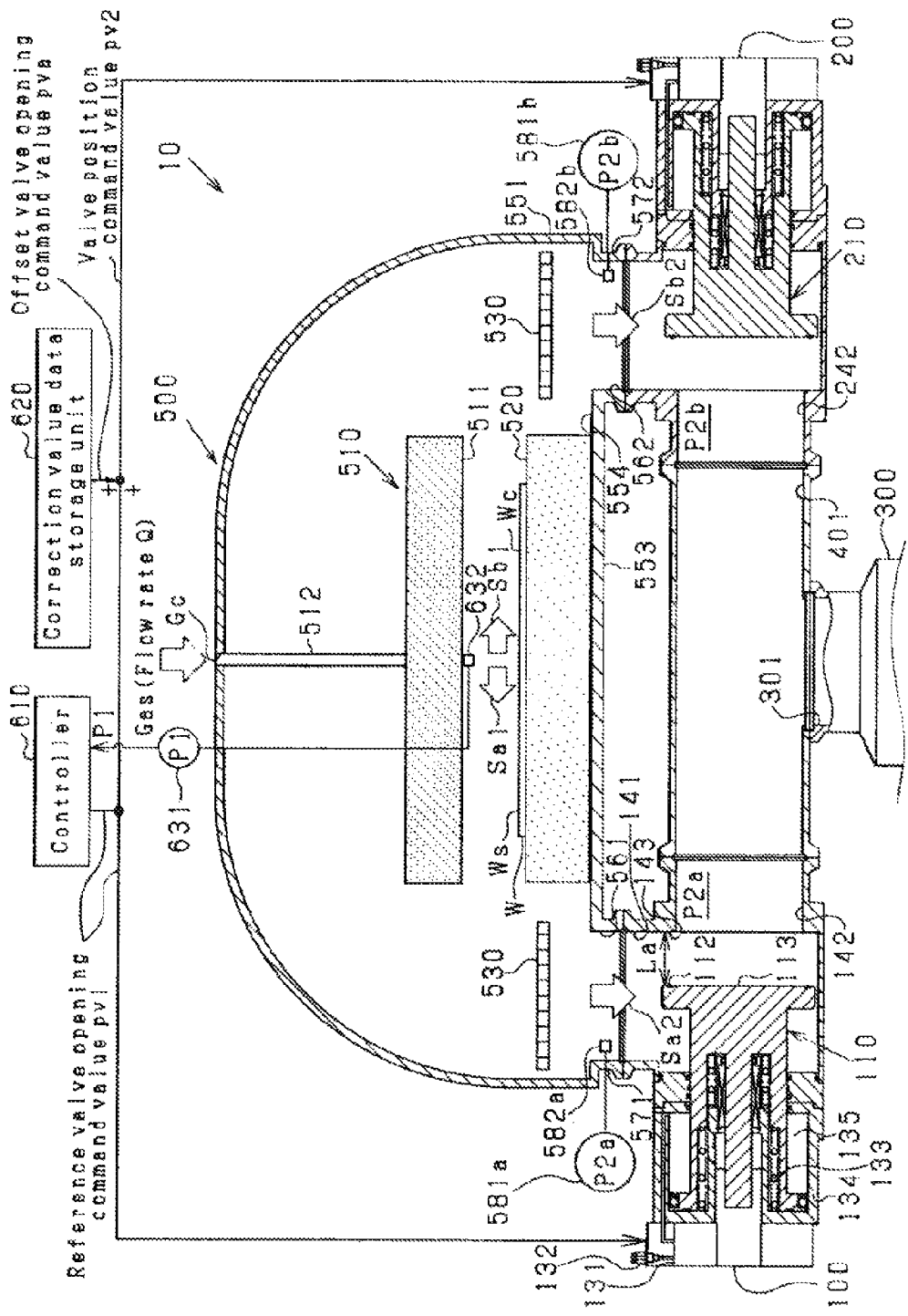
FIG. 10 is a sectional view showing the configuration of a vacuum control system 10a according to a modified example.

As shown in FIG. 10, the controller 610 transmits the reference valve opening command value pv1 to the vacuum control valve 100 and executes control to cause a vacuum pressure P1 to approach the pressure target value P1$t$. The controller 610 obtains the inlet pressure P2$a$ of the turbo-molecular pump 300 and the lift La from the vacuum control valve 100. The inlet pressure P2$a$ is measured as the pressure of the downstream side flow passage 142 by the pressure sensor 145 having the detection surface 146, and transmitted to the controller 610. The lift La is transmitted to the controller 610 from the Valve position sensor 138 via the electro-pneumatic control valve 131.

In step S140, the controller 610 determines whether a preset stable condition is established, and stores the lift La in the correction value data storage unit 620 in accordance with the determination. The stable condition may be established when both the deviation δm of the master loop and a deviation δ1 of the first slave loop remains smaller than a preset threshold for a fixed time, for example. Further, the controller 610 calculates the effective exhaust velocity Sa1 of the vacuum control valve 100 and stores the calculated effective exhaust velocity Sa1 in the correction value data storage unit 620.

FIG. 9 is an illustrative view showing formulae used to calculate the effective exhaust velocity Sa1. The effective exhaust velocity Sa1 is calculated as follows. Firstly, the controller 610 uses a formula F2 (see FIG. 9) to calculate a conductance C from the vicinity of the processing center Wc to the inlet of the turbo-molecular pump 300. Secondly, the controller 610 uses a formula F4 to calculate the effective exhaust velocity Sa1 from the conductance C and the effective exhaust velocity Sa2 of the turbo-molecular pump 300. Here, the conductance C can be calculated from a measured pressure P1$m$ measured in the vicinity of the processing center Wc by the pressure measurement unit 631 and a measurement value of the inlet pressure P2$a$ of the turbo-molecular pump 300, measured by a pressure sensor 122. The effective exhaust velocity Sa2 of the turbo-molecular pump 300, meanwhile, can be calculated using an equation of continuity F5. The controller 610 thus calculates the effective exhaust velocity Sa1 of the vacuum control valve 100 and stores a calculation result in the correction value data storage unit 620.

The formulae F1 to F4 are based on vacuum theory and determined as follows. The formula F2 is derived by numerically modifying the formula F1. The formula F1 is obtained by inserting the gas supply amount (Q/2), the measurement value of the inlet pressure P2$a$ of the turbo-molecular pump 300, and the vacuum pressure P1 (measurement value) in the vicinity of the processing center Wc into a definition formula for the conductance. The formula F4 is derived by numerically modifying the formula F3. The formula F3 is a theoretical formula expressing a relationship between the exhaust velocity, the conductance, and the effective exhaust velocity Sa1. The formula F5, meanwhile, is determined by handling the gas flow as a one-dimensional flow of a compressible fluid and using the fact that a mass flow rate is constant.

Note that in the first embodiment, the conductance C is calculated from the measurement value of the inlet pressure P2$a$ of the turbo-molecular pump 300 in order to facilitate understanding of the concept of the invention. However, with the vacuum chamber 500 according to the first embodiment, it is sufficient to obtain the lift La at a point where the measured pressure P1m measured by the pressure measurement unit 631 in the vicinity of the processing center Wc matches the pressure target value P1$t$. In so doing, a valve lift La for realizing a suitable pressure P1$t$ at an appropriate flow rate (share=Q/2) for the processing can be obtained. In other words, a valve lift La for realizing an appropriate effective exhaust velocity Sa1 in the vicinity of the processing center Wc at the gas supply amount (Q/2) can be obtained (P1× Sa1=Q/2). Therefore, the conductance C does not necessarily have to be calculated.

In step S150, the user halts the control performed by the vacuum control valve 100 and closes the valve. The vacuum control valve 100 is closed after the gas supply is stopped. To prevent damage to the turbo-molecular pump 300, the turbo-molecular pump 300 is stopped after closing the vacuum control valve 100.

In step S160, the user sets target values of the vacuum control valve 200. The set target values are identical to the target values of the vacuum control valve 200. In other words, the target values are the pressure target value P1$t$ in the vicinity of the processing center Wc and the gas supply amount (Q/2: share apportioned to vacuum control valve 200) from the gas supply port Gc.

In step S170, the user causes the vacuum control valve 200 to performed vacuum control. The vacuum control method is identical to the vacuum control (step S130) performed by the vacuum control valve 100. In a step S180, the controller 610 determines whether a preset stable condition is established, and stores a lift Lb in the correction value data storage unit 620 in accordance with the determination. The method of obtaining the lift Lb is identical to the method of obtaining the lift La.

As a result, the lift La of the vacuum control valve 100 and a command value Ca at that time, and the lift Lb of the vacuum control valve 200 and a command value Cb at that time, can be obtained respectively at the respective apportioned flow rates (Q/2) at the point where the pressure target value P1*t* of the processing center Wc is achieved. The lift La is a lift of the vacuum control valve 100 for setting the pressure of the processing center Wc at the pressure target value P1*t* at the apportioned flow rate (Q/2). The lift Lb is a lift of the vacuum control valve 200 for setting the pressure of the processing center Wc at the pressure target value P1*t* at the apportioned flow rate (Q/2).

Hence, by activating vacuum control by both of the vacuum control valves 100, 200, the gas is discharged by both vacuum control valves 100, 200 at an identical apportioned flow rate (Q/2) with respect to the gas supply amount Q. This vacuum control may be understood as control for manipulating the conductance of the respective vacuum control valves 100, 200 in order to align the effective exhaust velocities Sa1, Sb1 (m^3/sec) generated in the processing center We by the route passing through the gas discharge port 561 and the route passing through the gas discharge port 562. The offset valve opening command value pva may be calculated as a difference between the command value Ca and the command value Cb.

Hence, the vacuum control system 10 according to the first embodiment is capable of calculating the offset valve opening command value pva semi-automatically and storing the calculated offset valve opening command value pva in the correction value data storage unit 620. In so doing, the control system of the first embodiment can be functioned. As a result, the effect of the gas flow on the processing surface Ws on operations of the vacuum control values in the vacuum control system can be suppressed, and therefore an even flow can be realized in the vicinity of the processing surface Ws.

In the first embodiment in particular, the two vacuum control valves 100, 200 move integrally and opening portion centers of the valves move similarly relative to the gravity direction. Therefore, gas flow bias caused by a shift in the opening portion centers of the valves is also effectively suppressed.

Note that in the embodiment described above, the flow passage internal pressure in the downstream side flow passage on the vacuum control valve 100 side is measured by the pressure sensor 145 (see FIG. 8), but pressure measurement may be performed individually in the gas discharge ports 561, 562, as shown by a modified example in FIG. 10. In this modified example, the pressure of the gas discharge port 561 is measured by a pressure sensor 581*a* having a pressure detection surface 582*a* and provided in the interior of the gas discharge port 561. Note that a pressure sensor 581*b* having a detection surface 582*b* for measuring the flow passage internal pressure P2*b* is provided similarly on the vacuum control valve 200 side. Similar processing to that of the embodiment described above can be performed with this Configuration using the formulae F1 to F5.

Accordingly, the pressure measurement position may be set in any position between the gas discharge port 561 and the inlet 301 of the turbo-molecular pump and any position between the gas discharge port 562 and the inlet 301 of the turbo-molecular pump. Note, however, that when the pressures P2*a*, P2*b* are measured downstream of the vacuum control valves 100, 200, as in the above embodiment, the pressures P2*a*, P2*b* vary acutely relative to the valve lift, and therefore the offset valve opening command value can be obtained precisely.

D. Configuration of Vacuum Control System 20 According to Second Embodiment

A vacuum control system 20 according to a second embodiment differs from the vacuum control system 10 according to the first embodiment in that a plurality of vacuum control valves 30 have a low hysteresis characteristic. The low hysteresis characteristic of the vacuum control valves 30 enables highly responsive and precise conductance manipulation, and as a result, a striking improvement can be achieved in an ability to manipulate a vector of a reaction gas flow.

Note that a single vacuum control valve 30 and a system in which the single vacuum control valve 30 is manipulated will be described below, but upon application of the present invention, the single vacuum control valve 30 is replaced by the respective vacuum control valves 100, 200.

Figure 11:
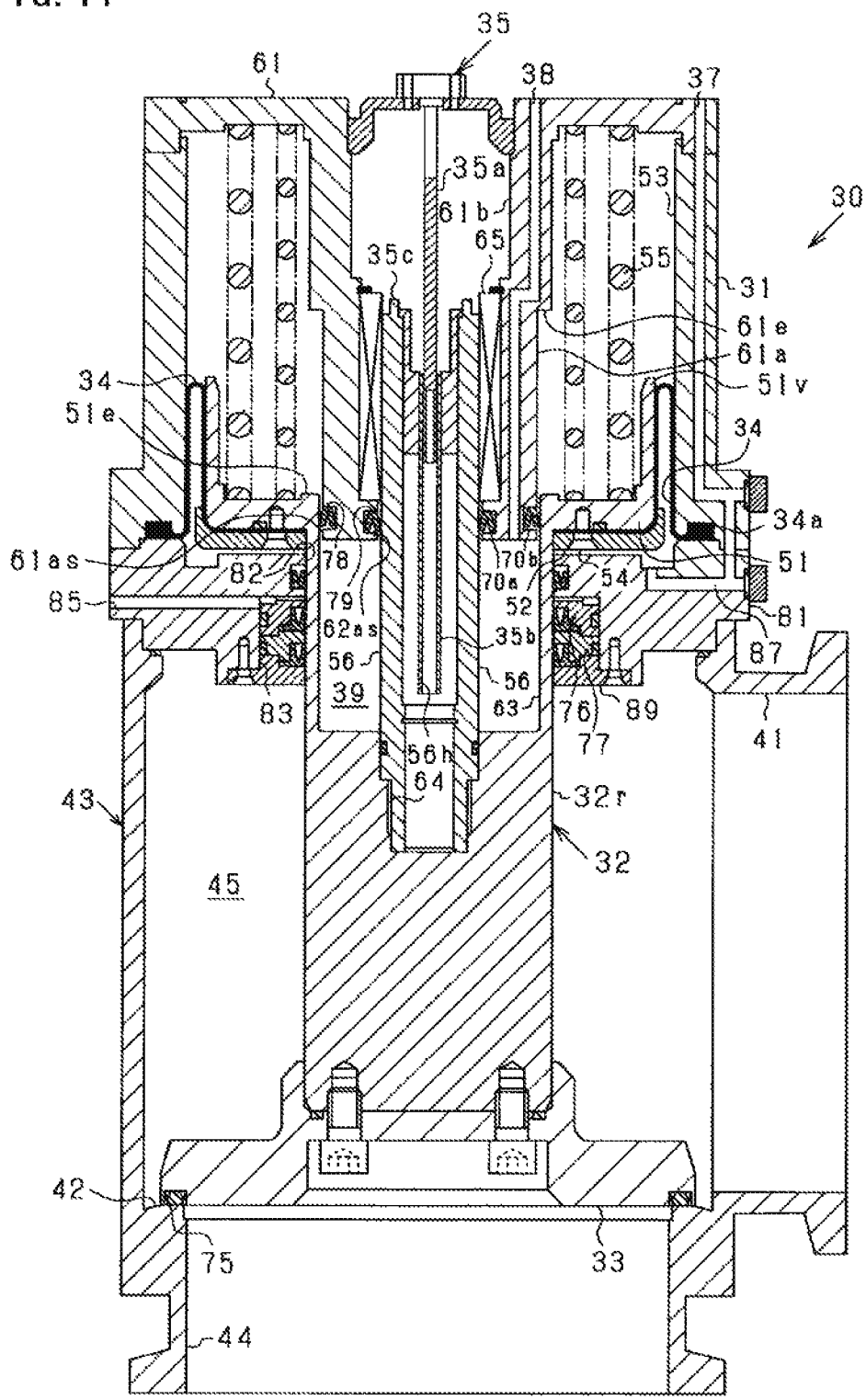
FIG. 11 is a sectional view showing the configuration of a vacuum control valve 30 according to a second embodiment when non-energized (fully closed)
Figure 12:
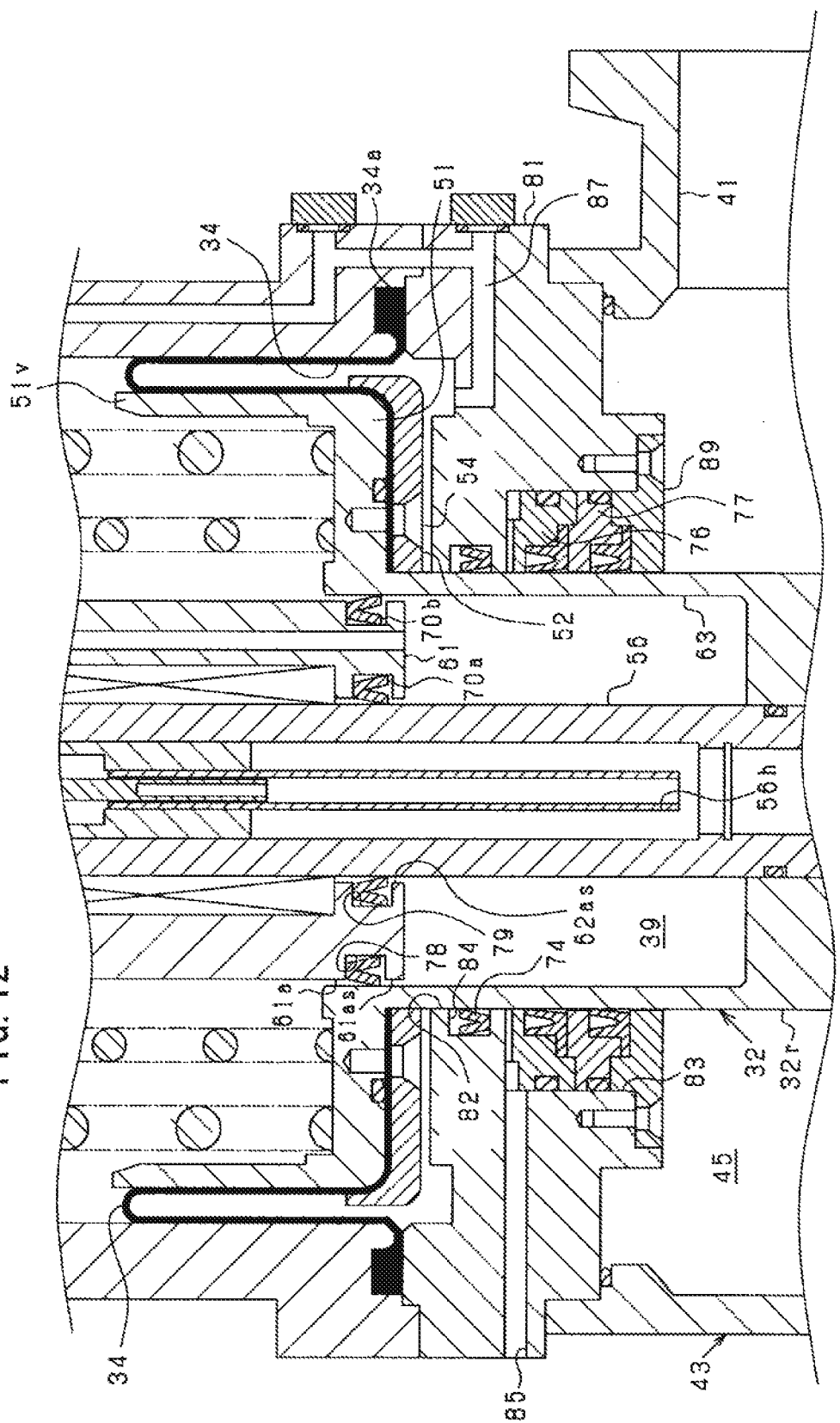
FIG. 12 is an enlarged sectional view showing the configuration of a rod cover 81 provided in the non-energized vacuum control valve 30.
Figure 13:
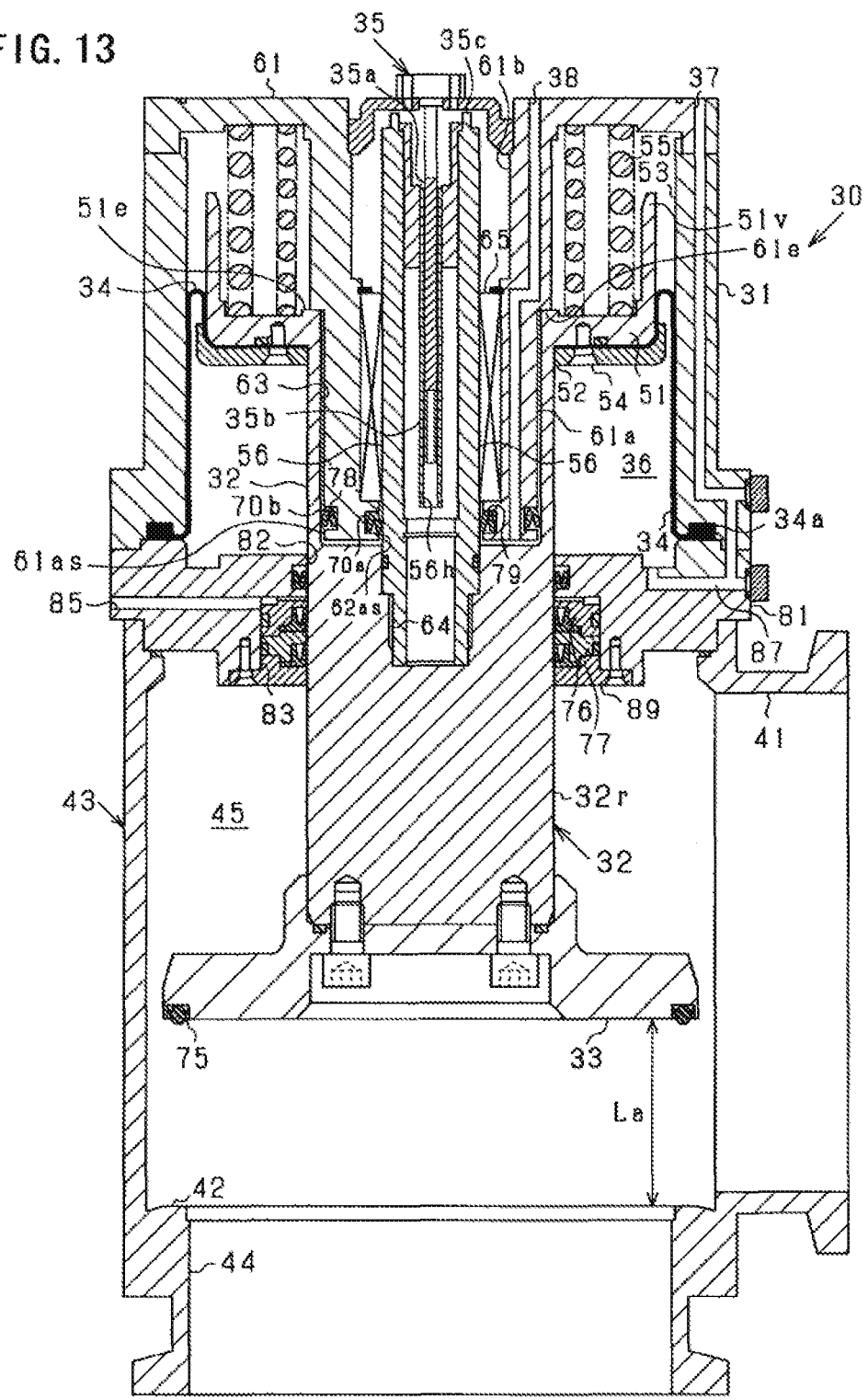
FIG. 13 is a sectional view showing the configuration of the vacuum control valve 30 when fully open.

FIG. 11 is a sectional view showing the configuration of the vacuum control valve 30 when non-energized (fully closed). FIG. 12 is an enlarged sectional view showing the configuration of a rod cover 81 provided in the non-energized vacuum control valve 30. FIG. 13 is a sectional view showing the configuration of the vacuum control valve 30 when fully open. The vacuum control valve 30 includes a control valve main body 43, a cylinder tube 31, and an operating member 32. The control valve main body 43 has a cylindrical shape extending in a movement direction (axial direction) of the operating member 32. A valve cage 45 constituted by a substantially columnar recessed portion that opens onto the cylinder tube 31 side in the axial direction is formed in the control valve main body 43. An opening portion of the valve cage 45 is closed by a rod cover 81 having a through hole 82 into which the operating member 32 is inserted to be capable of sliding.

The operating member 32 includes a valve body 33 provided in the valve cage 45 to manipulate a valve opening of the vacuum control valve 30, a rod 32*r* inserted into the through hole 82, and a piston 51 connected to an end portion of the rod 32*r*. The valve body 33 is connected to the rod 32*r* to be capable of varying the lift La by moving the operating member 32 in the axial direction. In this embodiment, the lift La corresponds to the valve opening. The operating member 32 corresponds to an operation unit.

The valve body 33 functions to block a flow passage by contacting a valve seat 42 formed on the control valve main body 43. The flow passage is blocked by causing the valve body 33 to contact the valve seat 42 in the interior of the valve cage 45 such that a secondary side port 44 is isolated from the valve cage 45. When the flow passage is blocked, a seal is realized by causing an O ring 75 projecting partially from the valve body 33 to contact the valve seat 42 such that the O ring 75 is crushed. The valve seat 42 is a ring-shaped region opposing the valve body 33 in the axial direction, for example, and having low surface roughness on the periphery of a connection port with the secondary side port 44. The O ring 75 is ring-shaped and provided in a position opposing the valve seat 42 in the axial direction.

The piston 51 is formed in a ring shape extending in a radial direction toward an inner peripheral surface 53 of the cylinder tube 31 such that a tightly sealed valve opening manipulation chamber 36 (see FIG. 13) is formed on the inner peripheral surface 53 of the cylinder tube 31. A tubular member 51*v* having a cylindrical shape that extends in the axial direction on an opposite side to the valve opening manipulation chamber 36 is connected to an outer peripheral end portion of the piston 51. A bellofram 34 for tightly sealing the valve opening manipulation chamber 36 is connected to the piston 51. Bellofram 34 means a bellofram type diaphragm.

The valve opening manipulation chamber 36 is formed as a variable volume donut-shaped enclosed space surrounded by the bellofram 34, the rod cover 81, the rod 32*r*, and the piston 51 (a bellofram retainer 52). An inner peripheral side end portion of the bellofram 34 is fastened between the piston 51 and the bellofram retainer 52 by a screw 54. Meanwhile, an outer peripheral side end portion 34a of the bellofram 34 is sandwiched between the cylinder tube 31 and the rod cover 81. Hence, the bellofram 34 is closed off (sealed) from the rod cover 81 and the cylinder tube 31. The valve opening manipulation chamber 36 is formed by dividing an internal space formed by the inner peripheral surface 53 using the bellofram 34. Manipulation air can be supplied to the valve opening manipulation chamber 36 through a valve opening air flow passage 37 and a connecting flow passage 87. A method of supplying the manipulation air will be described below. The manipulation air corresponds to working fluid.

The bellofram 34 is a flexible space dividing member that is shaped like a stovepipe hat and is capable of a following motion or a rolling motion (movement of a folded-back part) in a long stroke. The bellofram 34 tightly seals a gap between an outer peripheral surface 51s (see FIG. 13) of the piston 51 and the inner peripheral surface 53 of the cylinder tube 31 while following an operation of the piston 51. The bellofram 34 is also known as a rolling diaphragm, and since the bellofram 34 does not generate surface contact that causes friction between the operating member 32 and the valve opening manipulation chamber 36, it exhibits extremely small rolling resistance. Accordingly, the bellofram 34 possesses unique characteristics such as low hysteresis, fine pressure responsiveness, and a high sealing performance. To ensure that the bellofram 34 can roll smoothly, a gap is secured between the outer peripheral surface 51s and the inner peripheral surface 53 by a linear bearing 65. The linear bearing 65 will be described in detail below.

The bellofram 34 tightly seals a sliding portion between the inner peripheral surface 53 of the cylinder tube 31, which has the largest diameter in the vacuum control valve 30, and the piston 51, and therefore a friction surface can be eliminated, enabling a dramatic reduction in sliding frictional resistance in the operating member 32. Hence, by manipulating the pressure of the manipulation air supplied to the valve opening air flow passage 37 from an electro-pneumatic control valve 26, highly responsive adjustment of the lift La is realized with a low hysteresis characteristic. Note that the operating member 32 may be moved using an electric motor.

Meanwhile, as shown in FIG. 12, a seal is formed between the rod 32r and the rod cover 81 as follows. An attachment recessed portion 83 is formed in the through hole 82 of the rod cover 81 in a position near the valve cage 45 side, and an attachment groove 84 is formed in a position closer to the cylinder tube 31 side than the attachment recessed portion 83. A first stage low load seal 76 and a second stage low load seal 77 exhibiting comparatively low pressure resistance and low sliding frictional resistance are fitted in the attachment recessed portion 83. Packing 74 exhibiting comparatively high pressure resistances is fitted in the attachment groove 84. Meanwhile, a leak detection port 85 that communicates with the attachment recessed portion 83 between the packing 74 and the first stage low load seal 76 and penetrates to the outside is formed in the rod cover 81.

The leak detection port 85 is capable of detecting a leak in the packing 74 and a leak in the first stage low load seal 76 and second stage low load seal 77. A leak in the packing 74 may be detected as a manipulation air leak. A leak in the first stage low load seal 76 and second stage low load seal 77 may be detected by injecting helium gas into the leak detection port 85 and setting the valve cage 45, which is connected to a helium leak detector (not shown), in a vacuum state.

The piston 51 is biased by a biasing spring 55. The biasing spring 55 applies a biasing force to the piston 51 of the operating member 32 in a direction for reducing both the lift La and a volume of the valve opening manipulation chamber 36. The biasing spring 55 is housed in a space surrounded by the inner peripheral surface 53 of the cylinder tube 31 and a ring-shaped head cover 61. One end of the biasing spring 55 contacts the piston 51 on an opposite side (a rear side) of the axial direction to the valve opening manipulation chamber 36. The other end of the biasing spring 55 contacts the head cover 61.

The head cover 61 includes a tube portion 61b having a cylindrical shape, and a sliding convex portion 61a having a cylindrical shape with a smaller diameter than the tube portion 61b. The sliding convex portion 61a and the tube portion 61b of the head cover 61 have a common central axis. A diameter difference between the sliding convex portion 61a and the tube portion 61b forms a stroke limiting surface 61e. The stroke limiting surface 61e is a contact surface that limits a rising amount of the piston 51 by contacting a stroke limiting end portion 51e formed on the piston 51. As a result, the stroke of the piston 51 is limited in a rising direction (a lift La increasing direction) by the stroke limiting surface 61e and limited in a falling direction (a lift La reducing direction) by the valve seat 42.

The sliding convex portion 61a is housed in a shutoff load generation chamber 39 formed in the interior of the operating member 32. The shutoff load generation chamber 39 is formed on an inner side of the valve opening manipulation chamber 36 relative to a center line extending in an operating direction of the operating member 32. Hence, the shutoff load generation chamber 39 is fitted in a position that overlaps the valve opening manipulation chamber 36 in the operating direction of the operating member 32. As a result, an increase in the size of the vacuum control valve 30 (in particular, a size increase in the operating direction of the operating member 32) caused by fitting of the shutoff load generation chamber 39 can be suppressed. Furthermore, a sliding radius of the head cover 61 can be reduced, and therefore sliding resistance generated when the shutoff load generation chamber 39 is fitted can be suppressed.

By having the shutoff load generation chamber 39 apply a shutoff load, an improvement can be achieved in the manufacturability of the vacuum control valve 30. The reason for this is that a setting load (a load when the valve is closed) of the biasing spring 55 during manufacture can be lightened, thereby facilitating manufacture. More specifically, in the related art, the biasing spring 55 must be fitted at a sufficient spring modulus for generating the shutoff load required during blocking (when the lift La is zero) and at an initial deflection amount for generating an initial load (a pre-load).

The inventor has discovered that when an aperture of the vacuum control valve 30 increases, both the spring modulus and the initial deflection amount become excessive, leading not only to an increase in the size of the vacuum control valve 30 but also increased manufacturing difficulty. With this Configuration, however, the shutoff load is generated by the head cover 61 and the shutoff load generation chamber 39, and therefore the initial load of the biasing spring 55 can be lightened.

The linear bearing 65 is capable of a low-friction relative reciprocating motion in the axial direction (the movement direction of the operating member 32) while restraining a radial direction (a perpendicular direction to the axial direction) positional relationship between the head cover 61 and a guide rod 56. The linear bearing 65 is a space disposed on an inner side of an inner peripheral surface of the cylindrical sliding convex portion 61a and an outer side of an outer peripheral surface of the guide rod 56.

The guide rod 56 is connected to the operating member 32, and therefore the linear bearing 65 is also capable of maintaining (restraining) a positional relationship (a gap) between the piston 51 and the inner peripheral surface 53. Hence, by moving the folded-back part of the bellofram 34 smoothly, the operating member 32 can be moved relative to the cylinder tube 31 while generating substantially no friction.

A valve position sensor 35 for measuring an operation amount of the guide rod 56 relative to the head cover 61 is fitted to the guide rod 56. An insertion tube 35b into which is inserted a probe 35a of the valve body position sensor is connected to the guide rod 56 via an adapter 35c. The valve position sensor 35 is capable of generating an electric signal corresponding to an insertion length of the probe 35a into the insertion tube 35b. The operation amount of the guide rod 56 relative to the head cover 61 may be measured as a variation amount in the insertion length, and therefore the lift La can be measured in accordance with this variation amount. A Linear Pulse Coder (registered trademark) or the like, for example, may be used as the valve position sensor 35.

The head cover 61 has two tubular sliding surfaces sharing a central axis. A first sliding surface slides between an outer peripheral surface 61 as of the sliding convex portion 61a and an inner peripheral surface 63. The second sliding surface slides between an inner peripheral surface 62 as of the sliding convex portion 61a and the guide rod 56. Clearances (gaps) of the first sliding surface and the second sliding surface are maintained accurately by the linear bearing 65.

As described above, the linear bearing 65 is disposed between the sliding convex portion 61a and the guide rod 56 in order to maintain a mutual positional relationship between the sliding convex portion 61a and the linear bearing 65 regardless of an operation of the operating member 32. The precision of a gap between the shutoff load generation chamber 39 and the sliding convex portion 61a can therefore be improved easily. The linear bearing 65 likewise maintains a positional relationship with the packing 74 fitted into the through hole 82 regardless of an operation of the operating member 32, whereby the linear bearing 65 is kept closer to the packing 74 than a sliding surface between the piston 51 tightly sealed by the bellofram 34 and the inner peripheral surface 53. Accordingly, the sliding surfaces that require a high degree of precision in the gap formed relative to the sliding surface are disposed close to the linear bearing 65, and therefore both an improvement in sealing performance and a reduction in sliding resistance can be achieved easily.

With regard to the first sliding surface, a fitting groove 78 (see FIG. 12) having a recessed shape is formed in the outer peripheral surface 61 as around the entire outer periphery thereof, and V-shaped packing 70b is fitted into the fitting groove 78. With regard to the second sliding surface, a fitting groove 79 having a recessed shape is formed in the inner peripheral surface 62 as around the inner periphery thereof, and V-shaped packing 70a is fitted into the fitting groove 79. The V-shaped packing 70a, 70b will also be referred to as V packing.

Next, referring to FIG. 14, a method of manipulating the lift La of the vacuum control valve 30 will be described.

Figure 14:
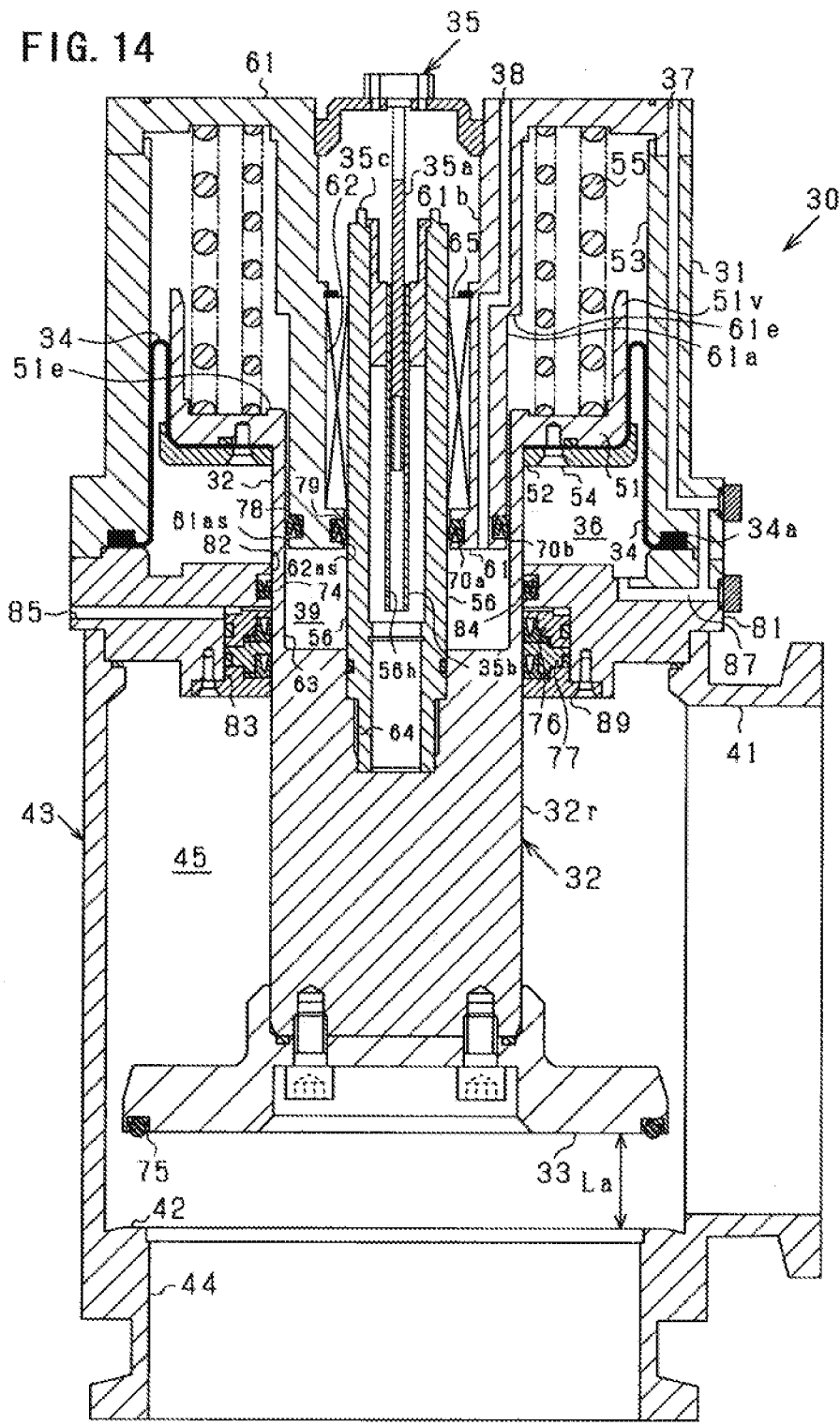
FIG. 14 is a sectional view showing an operation state during vacuum pressure control by the vacuum control valve 30.

FIG. 14 is a sectional view showing an operation state during vacuum pressure control by the vacuum control valve 30. As described above, the vacuum control valve 30 is capable of manipulating conductance between a primary side port 41 and a secondary side port 44 by adjusting the lift La, i.e. the distance between the valve body 33 and the valve seat 42, as a valve opening. The lift La is adjusted by moving the position of the operating member 32 relative to the valve seat 42. The conductance denotes the ease with which a fluid flows through a flow passage.

The lift La is manipulated in accordance with a balance between a driving force applied to the operating member 32 and the biasing force of the biasing spring 55, which is reciprocal to the driving force. The driving force applied to the operating member 32 is generated by a pressure action of the manipulation air in the interior of the valve opening manipulation chamber 36. During control of the lift La, it is desirable to reduce a frictional force caused by relative movement between the operating member 32 and the cylinder tube 31. The reason for this is that frictional force causes hysteresis and is therefore a large factor in impairing precise control.

As shown in FIG. 12, the operating member 32 has friction surfaces in three locations relative to the cylinder tube 31. A first friction surface is formed between the packing 70b fitted into the fitting groove 78 and the inner peripheral surface 63. A second friction surface is formed between the packing 70a fitted into the fitting groove 79 and the guide rod 56. A third friction surface is formed between the packing 74 fitted into the through hole 82 in the rod cover 81 and an outer peripheral surface of the rod 32r.

The third friction surface mainly reduces a manipulation pressure in the valve opening manipulation chamber 36, leading to a reduction in sliding resistance. In this embodiment, a reduction in the manipulation pressure of the valve opening manipulation chamber 36 can be realized by reducing the setting load (the load when the valve is closed) of the biasing spring 55, as described above. Further, it was confirmed in an experiment performed by the present inventor that by setting a surface roughness Ra on the outer peripheral surface of the rod 32r at approximately 0.2, both a reduction in sliding resistance and a required vacuum leak characteristic can be secured. Note that the third friction surface may be formed by covering the operating member 32 with a bellows such that the operating member 32 is sealed.

Figure 15:
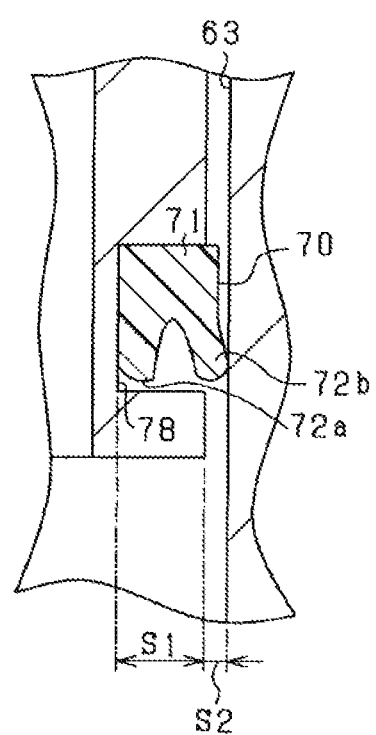
FIG. 15 is an enlarged sectional view showing a friction surface between packing 70 and an inner peripheral surface 63.

FIG. 15 is an enlarged sectional view of the first friction surface, or in other words the friction surface between the packing 70 fitted into the fitting groove 78 and the inner peripheral surface 63. The packing 70 is V-shaped packing having a heel portion 71 and a pair of lip portions 72a, 72b bifurcating from the heel portion 71. The packing 70 is formed to oppose the shutoff load generation chamber 39 on the side of the pair of lip portions 72b, leading to an increase in surface pressure on this side upon reception of pressure from the shutoff load generation chamber 39. The second friction surface is sealed similarly to the first friction surface.

When designing the sliding portion, the clearance S2 of the sliding portion and a difference between the depth S1 of the fitting groove 78 and a width direction size of the pair of lip portions 72a, 72b of the packing 70b are used as design parameters. In this embodiment, the shutoff load generation chamber 39 is required to be airtight only when the valve body 33 contacts the valve seat 42 such that the shutoff load is generated, and therefore a crushing amount of the packing 70b can be reduced, as will be described below. As a result, the amount of friction between the packing 70b and the inner peripheral surface 63 can be reduced, enabling a reduction in hysteresis.

Next, referring to FIGS. 16 to 18, a sealing mechanism realized by the packing 70b will be described in detail.

Figure 16:
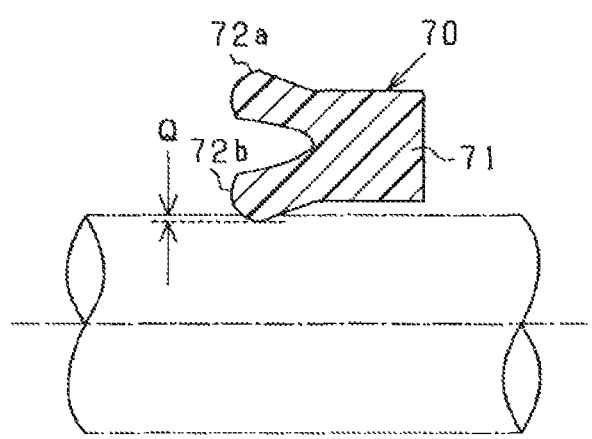
FIG. 16 is a pattern diagram showing the packing 70 in a fitted state in order to illustrate a sealing principle.

FIG. 16 is a pattern diagram showing the packing 70b in a fitted state in order to illustrate a sealing principle. FIG. 17 is a pattern diagram showing the shutoff load generation chamber 39 in a non-pressurized state in order to illustrate the sealing principle. FIG. 18 is a pattern diagram showing the shutoff load generation chamber 39 when pressurized in order to illustrate the sealing principle. FIGS. 16 to 18 show surface pressure distributions Pd1, Pd2 of the packing 70b. The shutoff load generation chamber 39 is pressurized only when the vacuum control valve 30 is blocked, and therefore the shutoff load generation chamber 39 is not pressurized in a state where control of the lift La is underway.

Figure 17:
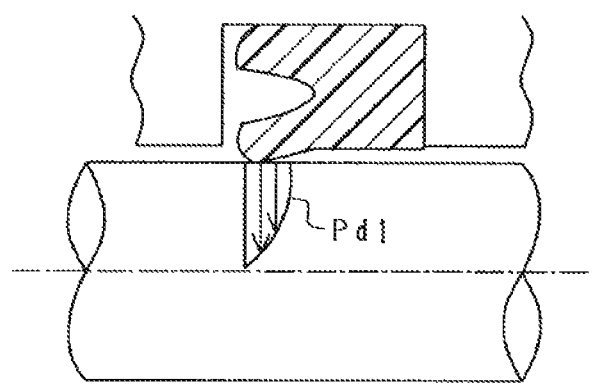
FIG. 17 is a pattern diagram showing a shutoff load generation chamber 39 in a non-pressurized state in order to illustrate the sealing principle.

As shown in FIG. 17, the packing 70b is fitted into the fitting groove 78 so as to be elastically deformed by a crushing amount Q. When pressurization is not underway, a contact surface pressure and a surface pressure region of the packing 70b are extremely small, as indicated by the surface pressure distribution Pd1. The reason for this is that the surface pressure distribution Pd1 is a surface pressure distribution generated by rigidity and the crushing amount Q of the pair of lip portions 72a, 72b. Hence, in a state where vacuum control is underway by the electro-pneumatic control valve 26 (i.e. when the shutoff load generation chamber 39 is not pressurized), extremely small kinetic friction is generated between the shutoff load generation chamber 39 and the head cover 61.

Figure 18:
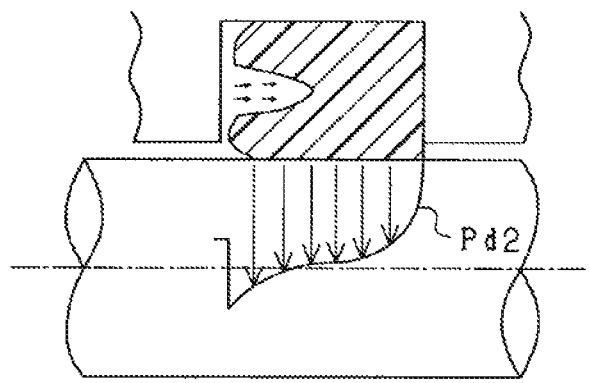
FIG. 18 is a pattern diagram showing the shutoff load generation chamber 39 when pressurized in order to illustrate the sealing principle.

As shown in FIG. 18, on the other hand, when the shutoff load generation chamber 39 applies the shutoff load, a sufficient sealing performance can be realized, as indicated by the surface pressure distribution Pd2. Furthermore, when the shutoff load is applied, a blocked state in which the valve body 33 contacts the valve seat 42 is established, and therefore relative movement between the shutoff load generation chamber 39 and the head cover 61 is not required. Moreover, a control state is not established, and therefore kinetic friction generation does not pose a problem. Furthermore, the present inventor discovered that since leakage can be permitted during sliding, the surface pressure distribution Pd1 can be reduced. Hence, the present inventor discovered that even when the shutoff load generation chamber 39 and the sliding convex portion 61a are provided in order to realize a shutoff load generation function, sliding of these components does not cause further hysteresis.

Next, referring to FIGS. 19 to 21, the vacuum control system 20 employing the vacuum control valve 30 will be described.

Figure 19:
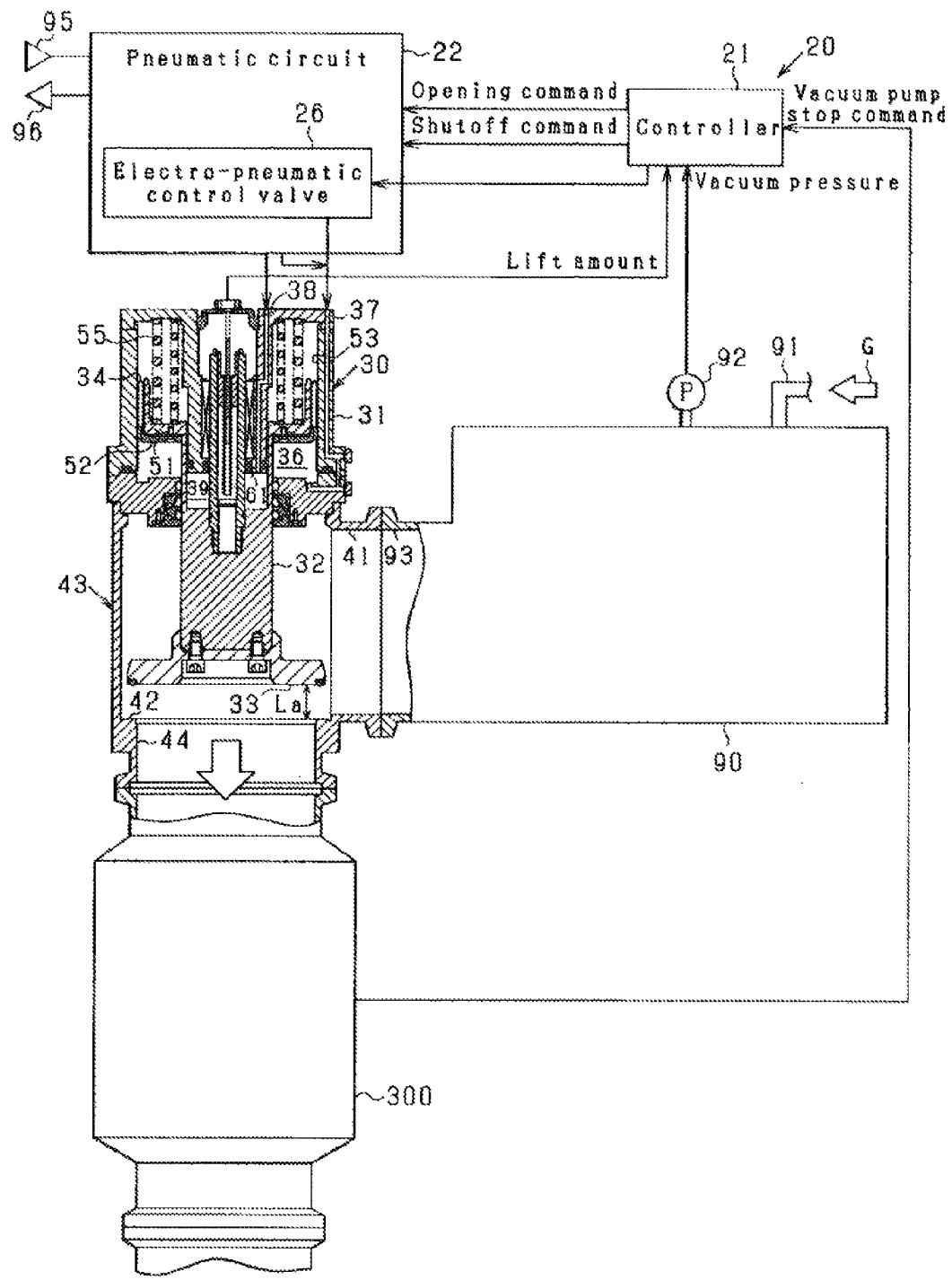
FIG. 19 is a pattern diagram showing the Configuration of a vacuum control system 20 according to an embodiment.

FIG. 19 is a pattern diagram showing the Configuration of the vacuum control system 20 according to this embodiment. The vacuum control system 20 includes a vacuum chamber 90 for executing an etching process, the vacuum control valve 30, a controller 21, a pneumatic circuit 22, the turbo-molecular pump 300, and a vacuuming dry pump connected in series with the turbo-molecular pump 300. A reactive gas G is supplied to the vacuum chamber 90 in a fixed supply amount and discharged by the turbo-molecular pump 300 via the vacuum control valve 30. A vacuum pressure of the vacuum chamber 90 is controlled by manipulating the conductance of the vacuum control valve 30. The turbo-molecular pump 300 corresponds to a vacuum pump.

The vacuum chamber 90 includes a reaction gas supply hole 91 through which the reactive gas G is supplied, an exhaust hole 93, and a vacuum pressure sensor 92. A fixed amount of the reactive gas G measured by a mass-flow sensor (not shown) is supplied to the reaction gas supply hole 91. The primary side port 41 of the vacuum control valve 30 is connected to the exhaust hole 93. The vacuum pressure sensor 92 measures the vacuum pressure in the interior of the vacuum chamber 90 and transmits an electric signal to the controller 21. The vacuum pressure is used during manipulation of the vacuum control valve 30 by the controller 21.

The internal pressure of the valve opening manipulation chamber 36 is manipulated by supplying or discharging manipulation air from the pneumatic circuit 22 through the valve opening air flow passage 37. The pneumatic circuit 22 is connected to a high pressure side working fluid supply portion 95 for supplying the manipulation air and a low pressure side working fluid discharge portion 96 for discharging the manipulation air.

The shutoff load functions as a load for moving the valve body 33 to the valve seat 42 and then pressing the valve body 33 against the valve seat 42 when the manipulation air is supplied to the blocking air flow passage 38 from the pneumatic circuit 22. The shutoff load acts as a resultant force in combination with a biasing load of the biasing spring 55.

In this embodiment, the shutoff load is applied when, for example, the controller 21 receives a vacuum pump stop signal from the turbo-molecular pump 300 and performs an emergency shutdown on the vacuum control system 20. Operation content in respective operating modes, including an emergency shutdown, will be described below. The controller 21 corresponds to a control unit. The vacuum pump stop signal is issued when the vacuum pump is stopped or a rotation speed of the turbo-molecular pump 300 falls irregularly, for example.

Next, referring to FIG. 20, operation content of the pneumatic circuit 22 and the vacuum control valve 30 will be described.

Figure 20:
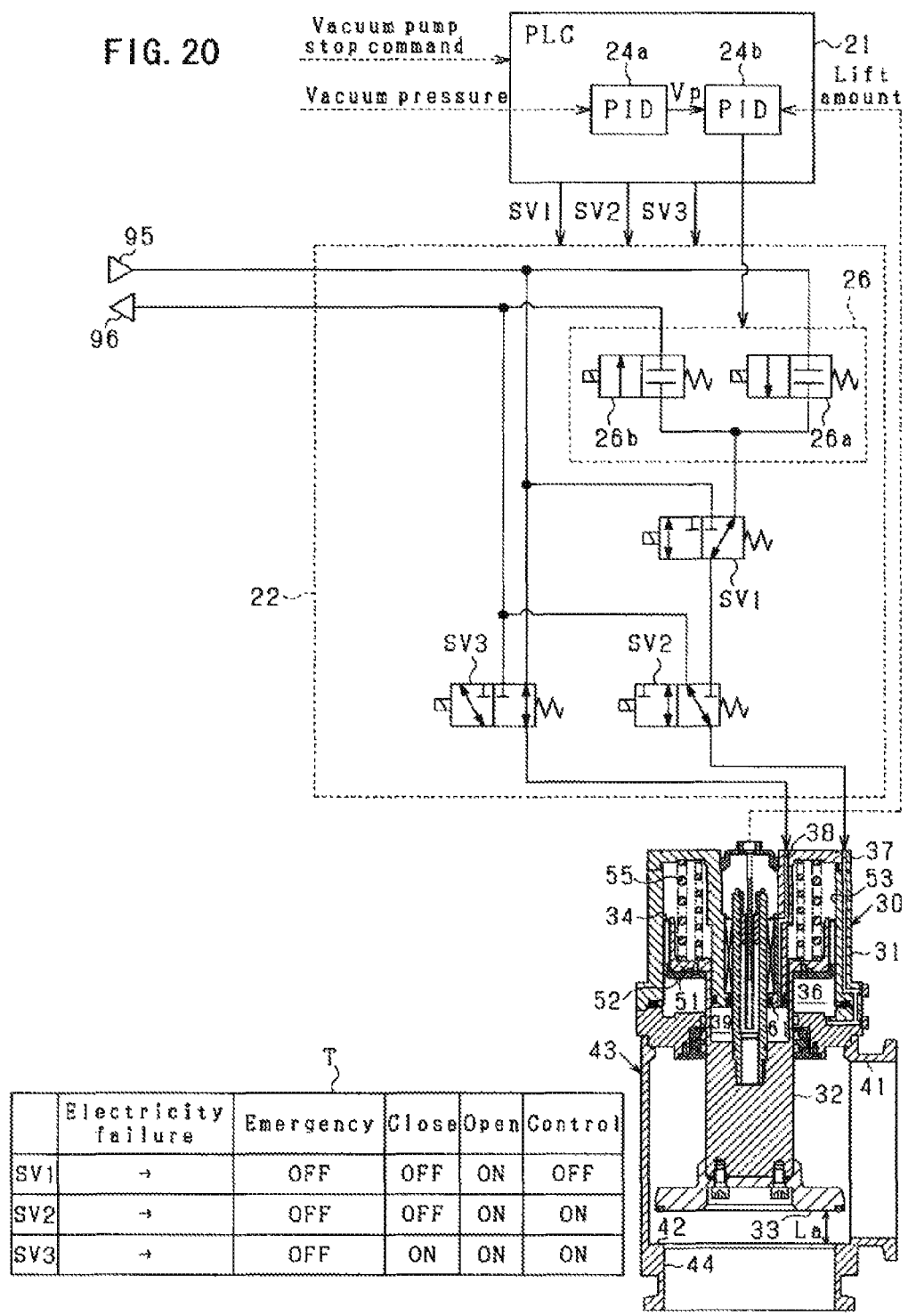
FIG. 20 is a pattern diagram showing the Configuration and operation content of a pneumatic circuit 22 according to an embodiment.

FIG. 20 is a pattern diagram showing the Configuration and operation content of the pneumatic circuit 22 according to this embodiment. The pneumatic circuit 22 supplies the manipulation air in accordance with a command from the controller 21 and manipulates the vacuum control valve 30 using the manipulation air. The pneumatic circuit 22 includes the electro-pneumatic control valve 26, and three solenoid valves SV1, SV2, SV3. The electro-pneumatic control valve 26 includes an intake valve 26a connected to a high pressure side of the manipulation air and an exhaust valve 26b connected to a discharge side of the manipulation air.

In this embodiment, the controller 21 is constituted by a programmable logic controller (PLC) having two inbuilt PID control circuits 24a, 24b. The programmable logic controller 21 is a logic circuit that can realize highly reliable control using ladder logic, for example. The two PID control circuits 24a, 24b are used in feedback control of the vacuum pressure of the vacuum chamber 90, and will be described in detail below. The controller 21 transmits ON/OFF commands for each of the three solenoid valves SV1, SV2, SV3 and a pulse width modulation signal for the electro-pneumatic control valve 26 to the pneumatic circuit 22. The solenoid valve SV2 and the solenoid valve SV3 will also be referred to as a first solenoid valve and a second solenoid valve, respectively.

The electro-pneumatic control valve 26 can manipulate a pressure at which compressed air is supplied into the valve opening air flow passage 37 from the outside by manipulating opening times (duties) of the intake valve 26a and the exhaust valve 26b using a well known pulse width modulation system, for example. The electro-pneumatic control valve 26 can increase an air pressure exerted on the operating member 32 by the valve opening manipulation chamber 36 by increasing the opening time (duty) of the intake valve 26a and reducing the opening time of the exhaust valve 26b. In so doing, the lift La of the valve body 33 can be increased.

By reducing the opening time (duty) of the intake valve 26a and increasing the opening time of the exhaust valve 26b, on the other hand, the electro-pneumatic control valve 26 can reduce the air pressure exerted on the operating member 32 by the valve opening manipulation chamber 36. In so doing, the lift La of the valve body 33 can be reduced by a load from the biasing spring 55.

The solenoid valve SV1 switches a flow passage connected to the solenoid valve V2 to one of the electro-pneumatic control valve 26 and the working fluid supply portion 95, and is connected to the electro-pneumatic control valve 26 when not energized. The solenoid valve SV2 switches a flow passage connected to the valve opening air flow passage 37 to one of the solenoid valve SV1 and the working fluid discharge portion 96, and is connected to the working fluid discharge portion 96 when not energized. The solenoid valve SV3 switches a flow passage connected to the blocking air flow passage 38 to one of the working fluid supply portion 95 and the working fluid discharge portion 96, and is connected to the working fluid supply portion 95 when not energized.

Next, referring to Table T, the content of each operating mode of the pneumatic circuit 22 will be described. Table T shows energization states of the three solenoid valves SV1, SV2, SV3 in each operating mode. In Table T, ON and OFF are indicated by "ON" and "OFF", respectively.

In an operating mode where an emergency shutdown is performed on the vacuum control system 20, the electro-pneumatic control valve 26 and the three solenoid valves SV1, SV2, SV3 are all OFF. An emergency shutdown is an operating mode serving as a worst case scenario according to the system design of the vacuum control system 20, in which the controller 21 receives the vacuum pump stop signal from the dry pump (not shown), for example. The dry pump is connected in series to the turbo-molecular pump 300 and is used for vacuuming. In this operating mode, atmospheric pressure is applied in its entirety as a differential pressure between the secondary side port 44, which is open to the atmosphere, and the vacuum side primary side port 41. This differential pressure load is applied to the valve body 33 in a direction for increasing the lift La, and acts in a direction for separating the valve body 33 from the valve seat 42 such that atmospheric air backflows into the vacuum chamber 90. In an emergency shutdown according to this embodiment, a backflow can be prevented against the differential pressure described above by the shutoff load.

Hence, the high pressure side working fluid supply portion 95 is connected to the blocking air flow passage 38 and the discharge side working fluid discharge portion 96 is connected to the valve opening air flow passage 37. Accordingly, the air pressure in the shutoff load generation chamber 39 for applying the shutoff load rises, while the interior of the valve opening manipulation chamber 36 for applying an opening side load (for increasing the lift La) falls to atmospheric pressure. As a result, the valve body 33 connected to the operating member 32 moves rapidly in the direction of the valve seat 42 such that the vacuum control valve 30 is set in a closed state (blocked) and the shutoff load continues to be applied.

Note that the solenoid valve SV3 may connect the flow passage connected to the blocking air flow passage 38 to the working fluid discharge portion 96 when not energized. As described above, however, by forming the solenoid valve SV3 to be connected to the working fluid supply portion 95 when not energized, power supply to the pneumatic circuit 22 is stopped during a service interruption, and therefore an operating mode having the same operation content as the emergency shutdown mode can be set, as indicated by arrows on Table T.

Hence, when the vacuum control system 20 is subjected to a service interruption or an emergency shutdown, the vacuum control valve 30 can be closed and the shutoff load can be applied in both operating modes. As a result, an air circuit is formed in the vacuum control system 20 according to this embodiment such that when power supply to the pneumatic circuit 22 is stopped, the valve body 33 is moved toward the valve seat 42 by the biasing force of the biasing spring 55 and the pressure of the shutoff load generation chamber 39, whereby the shutoff load is applied.

With this Configuration, a blocked state is invariably secured even when a power supply is OFF or service is interrupted, and therefore a system design that takes safety during an emergency shutdown or a service interruption into account can be realized easily. Furthermore, in this embodiment, the controller 21 sets the emergency stop operating mode upon reception of the vacuum pump stop signal, and therefore the blocked state can be secured even if the pressure of the secondary side port 44 increases due to an unforeseen stoppage of the turbo-molecular pump 300.

In an operating mode for closing the vacuum control valve 30, the two solenoid valves SV1, SV2 are switched OFF and the solenoid valve SV3 is switched ON. In this operating mode, the vacuum control valve 30 is closed while the turbo-molecular pump 300 continues to operate normally. In this operating mode, the biasing spring 55 is set to exert a sufficient load to crush the O ring 75 by an appropriate crushing amount for closing the vacuum control valve 30 during a normal operation. A durability of the O ring 75 can thus be improved.

Since this embodiment includes a mechanism for generating the shutoff load in response to an emergency, the biasing force of the biasing spring 55 can be set such that the O ring 75 is crushed by an appropriate crushing amount for a normal operation, and therefore an increase in design freedom can be achieved.

In an operating mode for opening the vacuum control valve 30, on the other hand, the three solenoid valves SV1, SV2, SV3 are all switched ON. In so doing, the high pressure side working fluid supply portion 95 is connected to the valve opening air flow passage 37 via the two ON solenoid valves SV1, SV2 while the exhaust side working fluid discharge portion 96 is connected to the blocking air flow passage 38 via the ON solenoid valve SV3. The electro-pneumatic control valve 26, meanwhile, is disconnected from the valve opening air flow passage 37 by the ON solenoid valve SV1. As a result, the vacuum control valve 30 can be opened (the lift La can be maximized) rapidly regardless of the operating condition of the electro-pneumatic control valve 26.

Finally, in an operating mode for controlling the vacuum pressure using the vacuum control valve 30, the solenoid valve SV1 is switched OFF and the two solenoid valves SV2, SV3 are switched ON. In so doing, the high pressure side working fluid supply portion 95 is connected to the valve opening air flow passage 37 via the electro-pneumatic control valve 26, the OFF solenoid valve SV1, and the ON solenoid valve SV2, in that order. The exhaust side working fluid discharge portion 96, on the other hand, is connected to the blocking air flow passage 38 via the ON solenoid valve SV3. As a result, the electro-pneumatic control valve 26 can adjust the lift La by supplying manipulation air from the valve opening air flow passage 37 to manipulate the internal pressure of the valve opening manipulation chamber 36.

Next, the control content of the vacuum control system 20 will be described with reference to FIG. 21.

Figure 21:
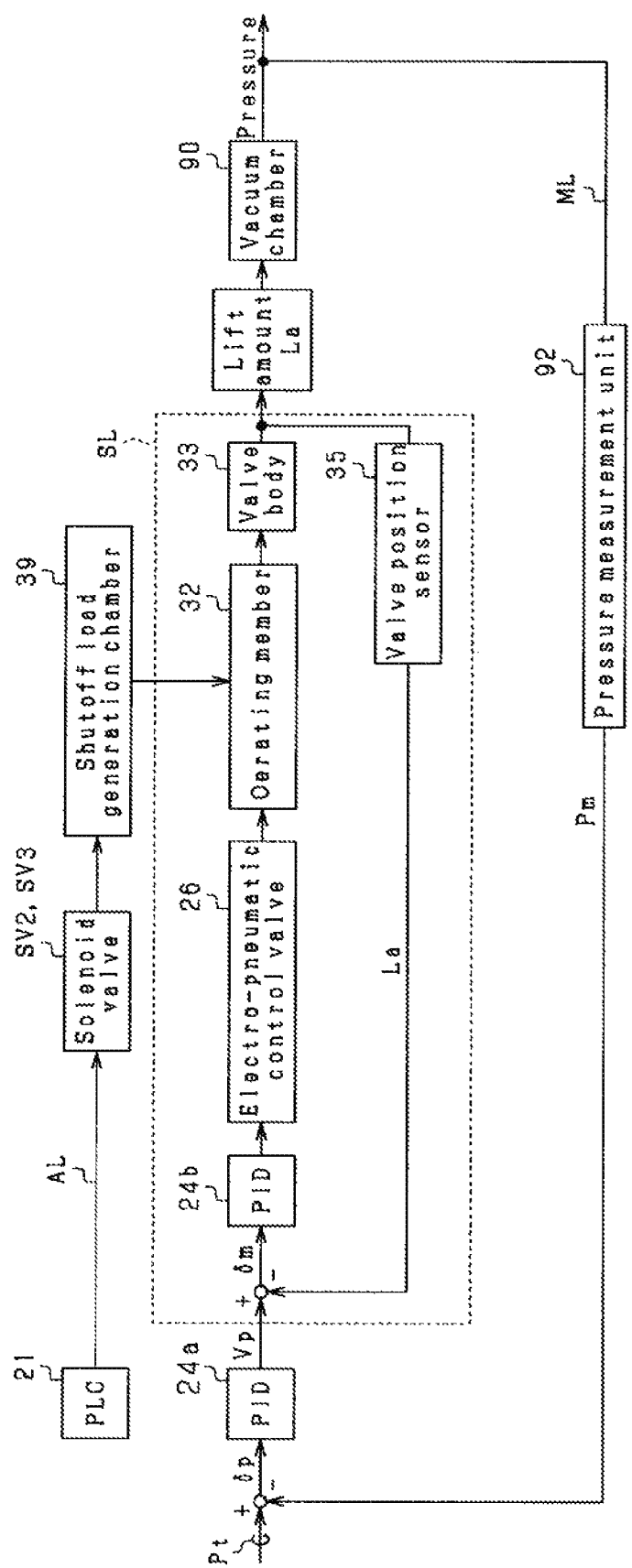
FIG. 21 is a control block diagram showing the vacuum control system 20 according to an embodiment.

FIG. 21 is a control block diagram of the vacuum control system 20 according to this embodiment. This control system is constituted by cascade control having a double loop structure that includes a slave loop SL for controlling the lift La of the valve body 33 in the vacuum control valve 30, and a master loop ML for controlling the internal pressure of the vacuum chamber 90. The respective control loops of the slave loop SL and the master loop ML may be constituted by a well known PID control system, for example.

The slave loop SL is a control loop in which the electro-pneumatic control valve 26 manipulates the internal pressure of the valve opening manipulation chamber 36 to cause the lift La of the valve body 33 to approach a valve opening command valve Vp. In the slave loop SL, the PID control circuit 24b generates a control signal in accordance with a deviation δm between the valve opening command value Vp (target value) and the lift La (measurement value), and transmits a pulse width modulation signal to the electro-pneumatic control valve 26. The electro-pneumatic control valve 26 manipulates the internal pressure of the valve opening manipulation chamber 36 in accordance with the pulse width modulation signal in order to adjust the driving force applied to the operating member 32 to which the valve body 33 is attached.

The lift La is measured by the valve position sensor 35 and used by the PID control circuit 24b as a feedback amount. Thus, the vacuum control valve 30 can feedback-control the lift La. As a result, the conductance of the flow passage between the vacuum chamber 90 and the turbo-molecular pump 300 can be adjusted.

In the master loop ML, the PID control circuit 24a determines the valve opening command value Vp in accordance with a deviation 8p between a preset target pressure value Pt and a measured pressure value Pm, and transmits the determined valve opening command value Vp to the PID control circuit 24b. The measured pressure value Pm is the internal pressure of the vacuum chamber 90 measured by the vacuum pressure sensor 92. The PID control circuit 24a adjusts the valve opening command value Vp such that the measured pressure value Pm approaches the target pressure value Pt.

Note that simple, single loop control in which the feedback loop relating to the lift La is eliminated and the internal pressure of the valve opening manipulation chamber 36 is manipulated to cause the deviation δp to approach zero may be provided instead. However, by providing a double loop configuration in which the lift La is fed back, a reduction in precision caused by non-linearity in the command value (control input) from the master loop ML and the lift (opening) can be suppressed. This reduction in precision occurs when opening ranges of the respective vacuum control valves are shifted relative to each other by an offset value. With this Configuration, the opening is actually measured, and therefore linearity can be secured in the opening and the control input. As a result, the characteristic of the vacuum control valve can be flattened in all opening ranges.

The vacuum control system 20 further includes an open loop AL for applying the shutoff load to the valve body 33 via the operating member 32. The programmable logic controller 21 generates the shutoff load by switching the two solenoid valves SV2, SV3 OFF such that air pressure is applied to the shutoff load generation chamber 39 (see FIG. 12). The magnitude of the shutoff load may be set in advance irrespective of the ON/OFF state of the solenoid valve SV1 by setting an inner diameter of the shutoff load generation chamber 39 and an outer shape of the head cover 61 appropriately.

Advantages of the embodiment described in detail above are as follows.

In the vacuum control valve 30 according to the second embodiment, an inner peripheral surface of a main cylinder having the largest diameter and an outer peripheral surface of a main piston are sealed from each other by a bellofram, and therefore sliding resistance can be reduced, enabling a reduction in hysteresis. Hence, with the vacuum control valve 30 according to the second embodiment, an accurate, low-hysteresis operation and accurate measurement in the corresponding operating condition can be realized easily. As a result, precise, highly responsive vacuum control can be realized.

Further, in the vacuum control valve 30 according to this embodiment, the shutoff load generation chamber 39 that generates the shutoff load using a supply of working fluid is formed in an operation unit, and therefore a space occupied by the operating member 32 can be used effectively to incorporate the shutoff load generation chamber 39. Furthermore, by forming the shutoff load generation chamber in the interior of the operation unit, design freedom can be provided in terms of reducing the diameter of the shutoff load generation chamber 39. As a result, an increase in the size of the vacuum control valve due to incorporation of the shutoff load generation chamber 39 can be suppressed, and a sliding surface area of the shutoff load generation chamber 39 can be reduced, enabling a reduction in hysteresis caused by friction in the shutoff load generation chamber 39.

In the vacuum control system 20 according to this embodiment, an air circuit is formed such that when power supply has been stopped to all of the solenoid valves, the valve body 33 immediately moves to the valve seat 42 such that the shutoff load is applied. Hence, a system design that takes safety during an emergency shutdown or a service interruption into account can be realized easily.

Note that in the second embodiment, the shutoff load generation chamber 39 and the blocking piston 61 are sealed from each other by packing, but the shutoff load generation chamber 39 and the blocking piston 61 may be sealed from each other by a bellofram. However, when the shutoff load generation chamber 39 and the blocking piston 61 are sealed from each other by packing, the vacuum control valve can be formed more easily and reduced in size.

Further, in the second embodiment, V-shaped packing is used on the sealing surface sealing the shutoff load generation chamber 39 from the blocking piston 61, but an O ring, for example, may be used instead since a contact surface pressure of the O ring likewise increases in accordance with the working fluid supply to the shutoff load generation chamber 39. Hysteresis can be reduced in the vacuum control valve as long as any typical sealing portion that increases in sealing surface pressure in accordance with the working fluid supply to the shutoff load generation chamber 39 is used to seal the shutoff load generation chamber 39 from the blocking piston 61. Note, however, that when V-shaped packing is used, kinetic friction can be reduced during non-pressurization.

In the second embodiment, the shutoff load generation chamber 39 is formed on the inside of the operating member 32 and the blocking piston 61 is disposed on the inside of the biasing spring. However, the shutoff load generation chamber 39 and the blocking piston 61 may be disposed in reverse. Note, however, that when the shutoff load generation chamber 39 is formed in the interior of the operating member 32, the interior space of the operating member 32 can be used to form the shutoff load generation chamber 39, enabling a reduction in the size of the vacuum control valve.

In the second embodiment, the vacuum control valve is connected such that the primary side port (a vacuum chamber side connection port) is on the low pressure side and the secondary side port (a vacuum pump side connection port) is on the high pressure side, and the blocked state is maintained by the shutoff load that acts against the resulting differential pressure load. However, the high pressure side and the low pressure side may be reversed. In so doing, an open state can be established against a differential pressure load that acts in a direction for maintaining the blocked state. Furthermore, the second embodiment may be used to control the pressure of a high-pressure vessel as well as a vacuum chamber.

E. Other Configurations

The first configuration show in summary of the invention may be modified as follows.

The second configuration is as follows. In the first configuration, the plurality of gas discharge ports are disposed in positions sandwiching a process reaction region inside of the vacuum chamber. The process reaction region is a space where the processing is performed. The pressure measurement unit measures a vacuum pressure of the processing reaction region.

This configuration can increase the vector of the gas flow in the vacuum chamber manipulated by adjusting the respective gas discharge ports while controlling the vacuum pressure in the processing reaction region. Further, by making an exhaust flow rate even, an even processing gas flow can be realized easily on the processing object surface.

The term "positions sandwiching the processing reaction region" does not necessarily mean positions on a parallel plane to a processing object plane, and the positions may be shifted in the vertical direction. Furthermore, when an odd number of gas discharge ports are provided, the term "positions sandwiching the processing reaction region" also includes a case in which the gas discharge ports are disposed at equal intervals or unequal intervals in annular positions centering on the processing gas supply unit.

The third configuration is as follows. In the second configuration, the controller may compensate for at least one of conductance differences and individual differences. The conductance differences are conductance differences from the processing reaction region to the respective gas discharge ports. The individual differences are individual differences among respective exhaust systems including the vacuum pump and the vacuum control valves, whereby exhaust flow rates of the plurality of vacuum control valves approach each other.

This third configuration realizes an even processing gas flow from the processing gas supply unit to the respective exhaust units on the processing object surface even when conductance differences from the processing reaction region to the respective exhaust units and individual differences among the exhaust systems exist. Further, design limitations caused by conductance can be alleviated, enabling an improvement in design freedom in the interior of the vacuum chamber.

The fourth configuration is as follows. In the second configuration, the controller may compensate for at least one of conductance differences and individual differences. The conductance differences are conductance differences from the processing reaction region to the respective gas discharge ports. The individual differences are individual differences among respective exhaust systems including the vacuum pump and the vacuum control valves, whereby effective exhaust velocities of the plurality of vacuum control valves in the processing reaction region approach each other.

With this configuration, the vacuum pressure and flow of the gas can be controlled easily using the effective exhaust velocity, which can be calculated directly on the basis of a measurable gas supply amount and the vacuum pressure of the processing gas.

The fifth configuration is as follows. In the third or fourth configuration, the controller may have an offset value storage unit and a target value setting unit. The offset value storage unit is configured to store an offset value used to compensate for at least one of the conductance differences and the individual differences The target value setting unit is configured to set a target value for controlling the openings of the plurality of vacuum control valves, using the offset value read from the offset value storage unit.

This configuration enables the control of the openings of the plurality of vacuum control valves easily.

The sixth configuration is as follows. In the fifth configuration, the plurality of vacuum control valves may have a shutoff function for blocking the gas flow. The controller is configured to generate the offset value on the basis of characteristic data relating to each of the plurality of vacuum control valves and to store the generated offset value in the offset value storage unit. The characteristic data are data for setting the target value obtained in a state where one of the plurality of vacuum control valves is operative and the other vacuum control valve is closed.

With this configuration, the characteristic data for the plurality of vacuum control valves can be obtained individually, and therefore the present invention can be implemented easily using a linearity of the gas flow. The data for setting the target value have a wide meaning and are not necessarily limited to data expressing the target value itself. For example, the data may express the opening of the vacuum control valve (a measurement value of the opening).

The seventh configuration is as follows. In the fifth or sixth configuration, the controller may include a main control unit and a plurality of dependent control units. The main control unit is configured to output a common opening command value that is a common command value for manipulating the respective openings of the plurality of vacuum control valves according to the measured vacuum pressure. The plurality of dependent control units are configured to control the respective openings of the plurality of vacuum control valves according to the common opening command value, each of the plurality of dependent control units being provided for each of the vacuum control valves. The respective dependent control units obtain actually measured values of the openings of the respective vacuum control valves and control the openings of the respective vacuum control valves based on the actually measured values, the common opening command value, and the offset value.

With this configuration, control is performed on the basis of actually measured values of the openings of the respective vacuum control valves, and therefore linearity can be secured in a relationship between a control input and the opening. By employing this linearity in this configuration, the control can be performed according to a common control law of the main control unit even when opening ranges of the respective vacuum control valves are shifted relative to each other by the offset value. In other words, with this configuration, linearity is secured between the opening and the control input by actually measuring the opening, and therefore variation in the characteristics of the vacuum control valves can be suppressed even when the opening ranges shift relative to each other.

The eighth configuration is as follows. In any one of first to seventh configurations, the plurality of vacuum control valves may be vacuum control valves for controlling the vacuum pressure in the vacuum chamber by manipulating valve opening using working fluid. The vacuum control valve may include a control valve main body, an operation unit, a cylinder, a biasing unit, and a bellofram. The control valve main body has a flow passage and a valve seat formed in the flow passage. The flow passage connects the vacuum chamber and the vacuum pump. The operation unit has a valve body, a piston, and a rod that joins the valve body and the piston. The valve body manipulates the valve opening by adjusting a lift and blocks the flow passage by contacting the valve seat. The lift is a distance between the valve body and the valve seat. The cylinder is connected to the control valve main body and housing the piston. The biasing unit is configured to press the operation unit in a direction for reducing the lift. The bellofram is configured to seal a gap between an outer peripheral surface of the piston and an inner peripheral surface of the cylinder following a movement of the piston. The operation unit and the cylinder include a valve opening manipulation chamber and a shutoff load generation chamber. The valve opening manipulation chamber is sealed by the bellofram. The valve opening manipulation chamber has a tubular shape surrounding the rod. Valve opening manipulation chamber generates a load applied to the piston in a direction for increasing the lift in accordance with a pressure exerted by the working fluid. The shutoff load generation chamber is configured to have a common axial center line with the valve opening manipulation chamber and to generate a load applied to the operation unit in a direction for reducing the lift in accordance with a supply of the working fluid.

With this configuration, the control is performed by a vacuum control valve in which the gap between the outer peripheral surface of the piston and the inner peripheral surface of the cylinder is tightly sealed by a sealing film-form elastic body while following an operation of the piston. The vacuum control valve is configured in this manner has a low hysteresis characteristic, and therefore a control capability of the vacuum control system can be improved dramatically.

The ninth configuration is as follows. In the eighth configuration, the cylinder may include a head cover having a sliding convex portion accommodated in the shutoff load generation chamber. The vacuum control valve includes a sealing unit having a sealing surface sealing between the shutoff load generation chamber and the sliding convex portion. A surface pressure of the sealing surface increases according to the supply of the working fluid to the shutoff load generation chamber.

In the vacuum control valve of ninth configuration, the sealing unit in which the surface pressure of the sealing surface increases in accordance with the supply of the working fluid to the shutoff load generation chamber is used in the shutoff load generation chamber. Therefore, during manipulation of the valve opening, or in other words when the vacuum control valve is not blocked, the surface pressure on the sealing surface of the shutoff load generation chamber can be suppressed, enabling low-friction sliding. As a result, low-hysteresis valve opening manipulation can be realized by a simple configuration without using a bellofram, for example.

The tenth configuration is as follows. In the ninth configuration, the sliding convex portion may have a cylindrical shape with a common central axis line with the valve opening manipulation chamber. An outer diameter of the sliding convex portion is smaller than an inner diameter of the valve opening manipulation chamber. The operation unit includes a guide portion extending in an operation direction within a space surrounded by an inner peripheral surface of the sliding convex portion. The vacuum control valve is disposed between the guide portion and the sliding convex portion, for enabling the slide in the operation direction. The vacuum control valve has a bearing for restraining a positional relationship between the guide portion and the sliding convex portion in a perpendicular direction to the operation direction.

With this configuration, the operation unit includes the guide portion extending in the operation direction within the space surrounded by the inner peripheral surface of the cylindrical sliding convex portion, and therefore a sliding surface of the sliding convex portion is disposed in a closer position to the bearing than a sliding surface of the bellofram. As a result, the precision of a sliding surface gap between the shutoff load generation chamber and the sliding convex portion, which requires a higher degree of strictness than the bellofram, can be improved easily.

The eleventh configuration is as follows. In any one of eighth to tenth configurations, the shutoff load generation chamber may be formed in an interior of the rod.

The twelfth configuration is as follows. In any one of eighth to tenth configurations, the controller may include a pressure sensor and a pneumatic circuit, and a control unit. The pressure sensor is configured to measure the vacuum pressure in the vacuum chamber. The pneumatic circuit is configured to supply the working fluid to the vacuum control valve. The pneumatic circuit is connected to a working fluid supply unit and a working fluid discharge unit. The working fluid supply unit supplies the working fluid. The working fluid discharge unit discharges the working fluid. The control unit is configured to control the vacuum pressure in the vacuum chamber by manipulating the working fluid supplied to the vacuum control valve from the pneumatic circuit.

The thirteenth configuration is as follows. In twelfth configurations, the controller may be configured to connect a flow passage between the valve opening manipulation chamber and the working fluid discharge unit and a flow passage between the shutoff load generation chamber and the working fluid supply unit, in response to a reception of a vacuum pump stop signal including information indicative of stoppage of the vacuum pump.

With this configuration, an operating mode for applying the shutoff load is set upon reception of the vacuum pump stop signal, and therefore a blocked state can be secured even if a pressure on the vacuum pump side increases due to an unforeseen stoppage of the vacuum pump. Note that "reception of the vacuum pump stop signal" has a wide meaning that also includes confirmation of the state of internal contacts on the vacuum pump side indicating that the vacuum pump is in an operative state and the absence of a vacuum pump normal signal, for example.

The fourteenth configuration is as follows. In twelfth or thirteenth configuration, the pneumatic circuit may include a first solenoid valve and a second solenoid valve. The first solenoid valve is configured to connect the flow passage between the valve opening manipulation chamber and the working fluid discharge unit in a non-energized state. The second solenoid valve is configured to connect the flow passage between the shutoff load generation chamber and the working fluid supply unit in the non-energized state.

With this configuration, an emergency shutoff state is invariably established when a power supply is switched OFF or an electric failure occurs. Therefore, a system design that takes safety during an emergency shutdown or an electric failure or an interruption into account can be realized easily.

Fifteenth configuration is a vacuum control method that uses a vacuum pump to control a vacuum pressure and a flow of a processing gas in a vacuum chamber that executes processing on a processing object upon reception of a supply of the processing gas from a gas supply unit. The vacuum control method includes a preparation step, a pressure measurement step, and a control step. The preparation step is for preparing respective vacuum control valves connected between a plurality of gas discharge ports disposed in different positions within the vacuum chamber and the vacuum pump. The pressure measurement step is for measuring the vacuum pressure of the processing gas supplied to the processing object. The control step is for manipulating respective openings of the plurality of vacuum control valves in accordance with the measured vacuum pressure.

F. Modified Examples

The present invention is not limited to the content of the embodiments described above and may be implemented as follows, for example.

(a) In the above embodiments, gas discharge along the route passing through the gas discharge port 561 and the route passing through the gas discharge port 562 is performed by the single turbo-molecular pump 300, but a turbo-molecular pump may be provided on each route, for example. In so doing, the flow passage from the turbo-molecular pump to the gas discharge port can be shortened, leading to an increase in the effective exhaust velocity and an improvement in pump efficiency.

(b) In the above embodiments, two gas discharge ports disposed in positions sandwiching the processing reaction region are used, but a plurality of three or more gas discharge ports may be used, for example. Furthermore, four turbo-molecular pumps may be connected to respective gas discharge ports (the number of gas discharge ports being four) via respective vacuum control valves (the number of vacuum control valves being four).

When an odd number of gas discharge ports (three, for example) are provided, the gas discharge ports are preferably disposed at equal intervals in annular positions centering on a processing supply unit or the processing center Wc. The term "positions sandwiching the processing reaction region" does not necessarily mean positions in a horizontal plane, or in other words a parallel plane to a processing object plane, and the positions may be shifted in a vertical direction. More specifically, the two discharge ports may be disposed on a lower surface or an upper surface of the vacuum chamber rather than the side faces (first embodiment). Alternatively, one of the discharge ports may be disposed on the lower surface and the other on the upper surface. Furthermore, when an odd number of gas discharge ports are provided, the term "positions sandwiching the processing reaction region" also includes a case in which the gas discharge ports are disposed at equal intervals or unequal intervals in annular positions centering on a processing gas supply unit.

(c) In the above embodiments, a difference between the target values of the first slave loop and the second slave loop is used as a correction value, but the target values of both the first slave loop and the second slave loop may have a correction value that is applied to a reference value, for example. This Configuration is effective when the correction value is stored on the vacuum control valve side, for example.

(d) Additional pressure sensors may be attached to the respective gas discharge ports (in the above embodiments, a total of five sensors are provided). In so doing, the conductance between the inlet of the turbo-molecular pump and the gas discharge ports can be obtained, and as a result, correction to compensate for individual differences on the exhaust system side or correction to compensate for conductance differences in the vacuum chamber from the processing center Wc to the gas discharge ports can be realized individually. It is typically sufficient to compensate for at least one of conductance differences from the gas supply unit to the respective exhaust units and individual differences among the respective exhaust systems, including the vacuum pump and the vacuum control valve.

(e) In the above embodiments, an example in which a chemical vapor deposition (CVD) process is implemented was described, but the present invention may also be used in etching processing and sputtering processing, for example. The present invention may typically be used in vacuum control of a vacuum chamber that requires control for maintaining a vacuum state while supplying a gas.

The above embodiments exhibit a striking effect when applied to etching processing. In etching processing, the processing object wafer W is disposed in the interior of a vacuum chamber, whereupon the processing surface of the wafer W is exposed to etching gas, for example. In reactive ion etching, for example, the etching gas is turned into plasma in the interior of the vacuum chamber through discharge ionization or the like, whereby a high-frequency magnetic field is generated by a cathode on which the wafer W is placed. As a result, ions and radicals in the plasma are accelerated in the direction of the wafer W so as to collide. As a result, ion sputtering and a chemical reaction in the etching gas occur simultaneously, and therefore etching can be performed with a suitably high degree of precision for microprocessing.

This type of high-precision etching is also applied to Micro Electric Mechanical Systems (MEM in order to realize practical applications of machine element components and integrated devices such as sensors, actuators, and electronic circuits. The reason for this is that in high-precision etching, a more even, stable supply of etching gas must be supplied to the wafer W.

(f) In the above embodiments, the two gas discharge ports are disposed in positions sandwiching the processing reaction region, but the gas discharge ports may be disposed in different positions. Thus, when setting the conditions of the semiconductor processing, manipulation of the direction of the processing gas may be used as a third manipulation parameter together with the pressure and flow rate of the processing gas, and therefore a new element of freedom can be obtained in relation to the flow direction of the processing gas. Manipulation of the processing gas direction may be fed back on the basis of the processing condition, for example.

(g) In the above embodiments, the turbo-molecular pump, the dry pump, and so on are used as the vacuum pump, but the dry pump may be used alone, for example, and any typical, widely-used vacuum pump may be employed.

(h) In the above embodiments, a vacuum chamber is used in the semiconductor manufacturing process, but the present invention may be used in another application. Note, however, that in a semiconductor manufacturing process, the processing is affected by minute variation in the gas flow, and therefore the present invention can exhibit striking effects.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A vacuum control valve connected between a vacuum chamber and a vacuum pump and configured to control the vacuum pressure in the vacuum chamber by manipulating valve opening using working fluid, the vacuum control valve comprising:
   a control valve main body comprising a flow passage and a valve seat formed in the flow passage, the flow passage connecting the vacuum chamber and the vacuum pump;
   an operation unit comprising a valve body, a piston, and a rod that joins the valve body and the piston, the valve body being configured to manipulate the valve opening by adjusting a lift that is a distance between the valve body and the valve seat and to block the flow passage by contacting the valve seat;

a cylinder configured to house the piston, a first side of the cylinder being connected to the control valve main body;
a head cover attached to the cylinder so as to cover an edge portion of the cylinder on a second side of the cylinder opposite to the first side;
a biasing unit configured to press the operation unit in a direction for reducing the lift; and
a bellofram configured to seal a gap between an outer peripheral surface of the piston and an inner peripheral surface of the cylinder following a movement of the piston, wherein
the operation unit and the cylinder include:
  a valve opening manipulation chamber sealed by the bellofram, the valve opening manipulation chamber having a tubular shape surrounding the rod and being configured to generate a load applied to the piston in a direction for increasing the lift in accordance with a pressure exerted by the working fluid; and
  a shutoff load generation chamber formed inside the rod, the shutoff load generation chamber having a common axial center line with the valve opening manipulation chamber and being configured to generate a load applied to the operation unit in a direction for reducing the lift in accordance with a supply of the working fluid,
the vacuum control valve further comprising:
  a sliding convex portion provided on the head cover and slidably accommodated in the shutoff load generation chamber, the sliding convex portion guiding a movement of the rod by sliding along an inner peripheral surface of the shutoff load generation chamber;
  a sealing unit provided to seal between the shutoff load generation chamber and the sliding convex portion; and
  a flow passage configured to supply the working fluid to the shutoff load generation chamber.

2. The vacuum control valve according to claim 1, wherein the sealing unit has a sealing surface, a surface pressure of the sealing surface increasing according to the supply of the working fluid to the shutoff load generation chamber.

3. The vacuum control valve according to claim 2, wherein the sliding convex portion has a common central axis line with the valve opening manipulation chamber and has a cylindrical shape with an outer diameter that is smaller than an inner diameter of the valve opening manipulation chamber,
the operation unit includes a guide portion extending in an operation direction of the operation unit within a space surrounded by an inner peripheral surface of the sliding convex portion, and
the vacuum control valve further comprises a bearing that is disposed between the guide portion and the sliding convex portion to slide in the operation direction and that is configured to restrain a positional relationship between the guide portion and the sliding convex portion in a perpendicular direction to the operation direction.

4. A vacuum control system, comprising:
the vacuum control valve according to claim 1;
a pressure sensor configured to measure the vacuum pressure in the vacuum chamber;
a pneumatic circuit connected to a working fluid supply unit configured to supply the working fluid and a working fluid discharge unit configured to discharge the working fluid, the pneumatic circuit being configured to supply the working fluid to the vacuum control valve; and
a control unit configured to control the vacuum pressure in the vacuum chamber by manipulating the working fluid supplied to the vacuum control valve from the pneumatic circuit.

5. The vacuum control system according to claim 4, wherein
the control unit is configured to transmit a command to connect a flow passage between the valve opening manipulation chamber and the working fluid discharge unit and a command to connect the flow passage between the shutoff load generation chamber and the working fluid supply unit, in response to a reception of a vacuum pump stop signal including information indicative of stoppage of the vacuum pump.

6. The vacuum control system according to claim 5, wherein
the pneumatic circuit includes a first solenoid valve and a second solenoid valve, the first solenoid valve being configured to connect the flow passage between the valve opening manipulation chamber and the working fluid discharge unit in a non-energized state, the second solenoid valve being configured to connect the flow passage between the shutoff load generation chamber and the working fluid supply unit in the non-energized state.

7. The vacuum control system according to claim 4, wherein
the pneumatic circuit includes a first solenoid valve and a second solenoid valve, the first solenoid valve being configured to connect the flow passage between the valve opening manipulation chamber and the working fluid discharge unit in a non-energized state, the second solenoid valve being configured to connect the flow passage between the shutoff load generation chamber and the working fluid supply unit in the non-energized state.

8. A vacuum control valve connected between a vacuum chamber and a vacuum pump and configured to control the vacuum pressure in the vacuum chamber by manipulating valve opening using working fluid, the vacuum control valve comprising:
a control valve main body comprising a flow passage and a valve seat formed in the flow passage, the flow passage connecting the vacuum chamber and the vacuum pump;
an operation unit comprising a valve body, a piston, and a rod that joins the valve body and the piston, the valve body being configured to manipulate the valve opening by adjusting a lift that is a distance between the valve body and the valve seat and to block the flow passage by contacting the valve seat;
a cylinder connected to the control valve main body and housing the piston;
a biasing unit configured to press the operation unit in a direction for reducing the lift; and
a bellofram configured to seal a gap between an outer peripheral surface of the piston and an inner peripheral surface of the cylinder following a movement of the piston, wherein
the operation unit and the cylinder include:
  a valve opening manipulation chamber sealed by the bellofram, the valve opening manipulation chamber having a tubular shape surrounding the rod and being configured to generate a load applied to the piston in a direction for increasing the lift in accordance with a pressure exerted by the working fluid; and
  a shutoff load generation chamber having a common axial center line with the valve opening manipulation chamber and being configured to generate a load applied to the operation unit in a direction for reducing the lift in accordance with a supply of the working fluid, the cylinder includes a head cover comprising a sliding convex portion accommodated in the shutoff load generation chamber, and the vacuum control valve includes a sealing unit having a sealing surface sealing between the shutoff load generation chamber and the sliding convex portion, the sealing surface applying a surface pressure increasing according to the supply of the working fluid to the shutoff load generation chamber.

9. The vacuum control valve according to claim 8, wherein the sliding convex portion has a common central axis line with the valve opening manipulation chamber and has a cylindrical shape with an outer diameter that is smaller than an inner diameter of the valve opening manipulation chamber, the operation unit includes a guide portion extending in an operation direction of the operation unit within a space surrounded by an inner peripheral surface of the sliding convex portion, and the vacuum control valve further comprises a bearing that is disposed between the guide portion and the sliding convex portion to slide in the operation direction and that is configured to restrain a positional relationship between the guide portion and the sliding convex portion in a perpendicular direction to the operation direction.

10. The vacuum control valve according to claim 8, wherein the sealing unit comprises a V-shaped packing.

11. A vacuum control system, comprising:

the vacuum control valve according to claim 8;

a pressure sensor configured to measure the vacuum pressure in the vacuum chamber;

a pneumatic circuit connected to a working fluid supply unit configured to supply the working fluid and a working fluid discharge unit configured to discharge the working fluid, the pneumatic circuit being configured to supply the working fluid to the vacuum control valve; and a control unit configured to control the vacuum pressure in the vacuum chamber by manipulating the working fluid supplied to the vacuum control valve from the pneumatic circuit.

12. The vacuum control system according to claim 11, wherein the control unit is configured to transmit a command to connect a flow passage between the valve opening manipulation chamber and the working fluid discharge unit and a command to connect a flow passage between the shutoff load generation chamber and the working fluid supply unit, in response to a reception of a vacuum pump stop signal including information indicative of stoppage of the vacuum pump.

13. The vacuum control system according to claim 12, wherein the pneumatic circuit includes a first solenoid valve and a second solenoid valve, the first solenoid valve being configured to connect the flow passage between the valve opening manipulation chamber and the working fluid discharge unit in a non-energized state, the second solenoid valve being configured to connect the flow passage between the shutoff load generation chamber and the working fluid supply unit in the non-energized state.

14. The vacuum control system according to claim 11, wherein the pneumatic circuit includes a first solenoid valve and a second solenoid valve, the first solenoid valve being configured to connect the flow passage between the valve opening manipulation chamber and the working fluid discharge unit in a non-energized state, the second solenoid valve being configured to connect the flow passage between the shutoff load generation chamber and the working fluid supply unit in the non-energized state.

15. A vacuum control valve connected between a vacuum chamber and a vacuum pump and configured to control the vacuum pressure in the vacuum chamber by manipulating valve opening using working fluid, the vacuum control valve comprising:

a control valve main body comprising a flow passage and a valve seat formed in the flow passage, the flow passage connecting the vacuum chamber and the vacuum pump;

an operation unit comprising a valve body, a piston, and a rod that joins the valve body and the piston, the valve body being configured to manipulate the valve opening by adjusting a lift that is a distance between the valve body and the valve seat and to block the flow passage by contacting the valve seat;

a cylinder configured to house the piston, a first side of the cylinder being connected to the control valve main body;

a biasing unit configured to press the operation unit in a direction for reducing the lift; and a bellofram configured to seal a gap between an outer peripheral surface of the piston and an inner peripheral surface of the cylinder following a movement of the piston, wherein the operation unit and the cylinder include:

a valve opening manipulation chamber sealed by the bellofram, the valve opening manipulation chamber having a tubular shape surrounding the rod and being configured to generate a load applied to the piston in a direction for increasing the lift in accordance with a pressure exerted by the working fluid; and a shutoff load generation chamber formed inside the rod, the shutoff load generation chamber having a common axial center line with the valve opening manipulation chamber and being configured to generate a load to be applied to the operation unit in a direction for reducing the lift in accordance with a supply of the working fluid.

16. The vacuum control valve according to claim 15, further comprising:

a head cover attached to the cylinder so as to cover an edge portion of the cylinder on a second side of the cylinder opposite to the first side;

a sliding convex portion provided on the head cover and slidably accommodated in the shutoff load generation chamber, the sliding convex portion guiding a movement of the rod by sliding along an inner peripheral surface of the shutoff load generation chamber;

a sealing unit provided to seal between the shutoff load generation chamber and the sliding convex portion; and a flow passage configured to supply the working fluid to the shutoff load generation chamber.

* * * * *